US007241677B2

(12) United States Patent
Soininen et al.

(10) Patent No.: US 7,241,677 B2
(45) Date of Patent: *Jul. 10, 2007

(54) PROCESS FOR PRODUCING INTEGRATED CIRCUITS INCLUDING REDUCTION USING GASEOUS ORGANIC COMPOUNDS

(75) Inventors: Pekka Juha Soininen, Espoo (FI); Kai-Erik Elers, Portland, OR (US)

(73) Assignee: ASM International N.V., Bilthoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 11/110,345

(22) Filed: Apr. 19, 2005

(65) Prior Publication Data

US 2005/0215053 A1   Sep. 29, 2005

Related U.S. Application Data

(63) Continuation of application No. 10/276,663, filed as application No. PCT/FI01/00473 on May 15, 2001, now Pat. No. 6,921,712.

(30) Foreign Application Priority Data

May 15, 2000 (FI) .................................. 20001163

(51) Int. Cl.
*H01L 21/20* (2006.01)

(52) U.S. Cl. ...................... 438/597; 438/658; 438/686; 438/687; 438/FOR. 130; 257/44; 257/E21.202

(58) Field of Classification Search ............... 438/584, 438/597, 658, 685, 686, 687, FOR. 130; 257/44, E21.202

See application file for complete search history.

(56) References Cited

U.S. PATENT DOCUMENTS

| 4,058,430 A | 11/1977 | Suntola |
| 4,902,551 A | 2/1990 | Nakaso et al. |
| 5,106,454 A | 4/1992 | Allardyce et al. |

(Continued)

FOREIGN PATENT DOCUMENTS

DE    41 08 73    3/1925

(Continued)

OTHER PUBLICATIONS

Baglia, J., Associate Editor, "New Designs and Materials Tackle 1 Gb Memory Challenge," *Semiconductor International*, World Wide Web address: semiconductor.net.

(Continued)

*Primary Examiner*—Matthew Smith
*Assistant Examiner*—Thanh V. Pham
(74) *Attorney, Agent, or Firm*—Knobbe Martens Olson & Bear LLP

(57) ABSTRACT

This invention concerns a process for producing integrated circuits containing at least one layer of elemental metal which during the processing of the integrated circuit is at least partly in the form of metal oxide, and the use of an organic compound containing certain functional groups for the reduction of a metal oxide layer formed during the production of an integrated circuit. According to the present process the metal oxide layer is at least partly reduced to elemental metal with a reducing agent selected from organic compounds containing one or more of the following functional groups: alcohol (—OH), aldehyde (—CHO), and carboxylic acid (—COOH).

32 Claims, 10 Drawing Sheets

U.S. PATENT DOCUMENTS

| | | | |
|---|---|---|---|
| 5,382,333 | A | 1/1995 | Ando et al. |
| 5,711,811 | A | 1/1998 | Suntola et al. |
| 5,731,634 | A | 3/1998 | Matsuo et al. |
| 5,865,365 | A | 2/1999 | Nishikawa et al. |
| 5,939,334 | A | 8/1999 | Nguyen et al. |
| 6,006,763 | A | 12/1999 | Mori et al. |
| 6,033,584 | A | 3/2000 | Ngo et al. |
| 6,040,243 | A * | 3/2000 | Li et al. ............ 438/687 |
| 6,066,892 | A | 5/2000 | Ding et al. |
| 6,108,937 | A | 8/2000 | Raaijmakers |
| 6,124,189 | A | 9/2000 | Watanabe et al. |
| 6,130,123 | A | 10/2000 | Liang et al. |
| 6,136,163 | A | 10/2000 | Cheung et al. |
| 6,143,658 | A | 11/2000 | Donnelly et al. |
| 6,777,331 | B2 | 8/2004 | Nguyen |

FOREIGN PATENT DOCUMENTS

| | | |
|---|---|---|
| EP | 0 321 067 | 7/1988 |
| EP | 0 469 456 | 7/1991 |
| EP | 0 469 470 A1 | 2/1992 |
| EP | 0 880 168 | 5/1998 |
| GB | 368850 | 12/1930 |
| GB | 1518243 A | 7/1978 |
| GB | 2 340 508 A | 2/2000 |
| WO | WO 93/10652 | 5/1993 |
| WO | WO 98/01890 | 1/1998 |
| WO | WO 99/17343 | 4/1999 |
| WO | WO 00/03420 | 1/2000 |
| WO | WO 01/50502 A1 | 7/2001 |

OTHER PUBLICATIONS

Basceri, C., Ph.D. thesis, "Electrical and Dielectric Properties of (Ba,Sr) $TiO_3$ Thin Film Capacitors for Ultra-High Density Dynamic Random Access Memories," pp. 13-31, Raleigh, N.C. State University (1997).

Bursky, D., "Hit Up IEDM For Gigabit And Denser DRAMs And Merged Logic/Memory," *Electronic Design*, World Wide Web address: planetee.com, (Dec. 1, 1998).

Campbell, S.A. et al., "Titanium dioxide ($TiO_2$)-based gate insulators," *IBM J. Res. Develop.*, vol. 43, No. 3, pp. 383-392 (May 1999).

Fukuzumi, Y. et al., "Liner-Supported Cylinder (LSC) Technology to realize Ru/$Ta_2O_5$/Ru Capacitor for Future DRAMs," *IEEE*, IED 2000, Session 34 (2000).

Hones, P. et al., "MOCVD of ThinRuthenium Oxide Films: Properties and Growth Kinetics," *Chem. Vap. Deposition*, vol. 6, No. 4, pp. 193-198 (2000).

Inoue, N. et al., "Low thermal-budget fabrication of sputtered-PZT capacitor on multilevel interconnects for embedded FeRAM," *IEEE*, IED 2000, Session 34 (2000).

Integrated Circuit Engineering Corporation, Practical Integrated Circuit Fabrication Seminar (1998).

Jung, D. et al., "A Novel Ir/$IrO_2$/Pt-PZT-Pt/$IrO_2$/Ir Capacitor for a Highly Reliable Mega-Scale FRAM," *IEEE*, IED 2000, Session 34, (2000).

Kawamoto, Y. et al., "The Outlook for Semiconductor Processes and Manufacturing Technologies in the 0.1-µm Age," *Hitachi Review*, vol. 48, No. 6, pp. 334-339 (1999).

NEC Device Technology International, No. 48, pp. 4-8, (1998).

Onda N. et al., "Hydrogen Plasma Cleaning a Novel Process for IC-Packaging," p. 311, Worldwide Web Address: Semiconductor Fabtech.com.

SOI Technology: IBM's Next Advance in Chip Design.

Solanki R. et al., "Atomic Layer Deposition of Copper Seed Layers," *Electrochemical and Solid-State Letters*, vol. 3, No. 10, pp. 479-480 (2000).

Sundani et al., Oral presentation of dual damascene process, slides.

Ueno et al. "Cleaning of CHF3 plasma-etched SiO2/SiN/Cu via structures using a hydrogen plasma, an oxygen plasma, and hexafluoracetylacetone vapors," *J. Vac. Sci. Technology B*, vol. 16, No. 6, pp. 2986-2995 (1998).

Utriainen, M. et al., "Studies of NiO thin film formation by atomic layer epitaxy," *Materials Science & Engineering*, vol. B54, pp. 98-103 (1998).

Utriainen, M. et al., "Studies of metallic thin film growth in an atomic layer epitaxy reactor using $M(acac)_2$ (M = Ni, Cu, Pt) precursors," *Applied Surface Science*, vol. 157, pp. 151-158 (2000).

Winbond News Release, "Successful Development of Capacitator Technonolgy for Next Generation Memory," World Wide Web address: winbond.com, (Dec. 13, 2000).

Won, Seok-Jun et al., "Conformal CVD-Ruthenium Process for MIM Capacitor in Giga-bit DRAMs," *IEEE*, IED 2000, Session 34 (2000).

Xu, P. et al., "A Breakthrough in Low-k Barrier/Etch Stop Films for Copper Damascene Applications," *Semiconductor Fabtech*, 11th Edition , p. 239 (2000).

Yoon, Dong-Soo et al., "Investigation of $RuO_2$-Incorporated Pt Layer as a Bottom Electrode and Diffusion Barrier for High Epsilon Capacitor Applications," *Electrochemical and Solid-State Letters*, vol. 3, No. 8, pp. 373-376 (2000).

Yoon, Dong-Soo et al., "Tantalum-ruthenium dioxide as a diffusion barrier between Pt bottom electrode and $TiSi_2$ ohmic contact layer for high density capacitors," *Journal of Applied Physics*, vol. 86, No. 5, pp. 2544-2549 (1999).

Yoon, Y.-G. et al., 197th Meeting Program Information II, The Electrochemical Society, 197th Meeting—Toronto, Ontario, Canada, May 14-18, 2000, Program Information, I1—Rapid Thermal and Other Short-Time Processing Technologies I, Electronics Division/Dielectric Science and Technology Division/High Temperature Materials Division, Monday, Wednesday, May 17, 2000, New Applications of RTP, Co-Chairs: A. Fiory and D.-L Kwong, Time 11:10 Abs#550, Title: Development of RTA Process for the Crystallization of a-Si Thin Film—Y.-G. Yoon, T.-K. Kim, K.-B. Kim, J.-Y. Chio, B.-I Lee, and S.-K. Joo (Seoul National Univ.).

* cited by examiner

PROCESS FOR PRODUCING INTEGRATED CIRCUITS INCLUDING REDUCTION USING GASEOUS ORGANIC COMPOUNDS

REFERENCE TO RELATED APPLICATIONS

The present application is a continuation of non-provisional application Ser. No. 10/276,663, filed Nov. 15, 2002, now U.S. Pat. No. 6,921,712 entitled PROCESS FOR PRODUCING INTEGRATED CIRCUITS INCLUDING REDUCTION USING GASEOUS ORGANIC COMPOUNDS, which in turn is the U.S. National Phase of PCT application No. PCT/FI01/00473, filed on May 15, 2001 and which claims priority to Finnish application No. FI 20001163, filed May 15, 2000. Each of the priority applications is incorporated by reference herein.

BACKGROUND OF THE INVENTION

1. Field of the Invention

This invention relates to manufacturing of integrated circuits (IC), and in particular to the reduction of metal oxides on a substrate into elemental metals during the manufacturing of ICs.

2. Description of the Related Art

Interconnects, capacitor electrodes and gate metals in integrated circuits (IC) are made of metals. Especially copper is an attractive alternative for the interconnects due to its favourable electrical properties, such as low resistivity.

During the processing of integrated circuit a metal surface may become oxidised, whereby the resistivity of the metal surface and the interconnect thereof increases. An oxide layer on a metallic interconnect restricts the flow of electrons through the interconnect and is detrimental in high-speed applications of ICs.

On the other hand, insulators are needed in the integrated circuits to separate the metal wires electrically from each other. Typically the low dielectric constant materials that can be used as insulators do not endure high temperatures, i.e. temperatures of approximately 400° C. or more.

So called damascene and dual damascene structures (c.f. FIG. 8) are common thin film structures applied in the manufacturing of ICs. During the manufacturing of damascene and dual damascene structures, openings (vias) are made through an insulating layer to an underlying copper metal layer. Thus, insulator surface is exposed to gas atmosphere. It is detrimental to the electrical properties of insulators to evaporate any volatile metal compound from the bottom of the openings and chemisorb even one molecular layer of copper compound on the insulator surface. Damascene processing requires a diffusion barrier on the insulator surfaces to prevent the diffusion of copper to the insulator. After a diffusion barrier layer is deposited, it is not possible to remove an oxide layer from the copper surface located on the bottom of the vias. It is obvious that there is a need for method where metal oxide can be removed without forming any volatile metal compounds.

According to prior art an oxide layer on a metal layer can be removed or reduced. U.S. Pat. No. 5,939,334 and EP publication No. 0 880 168 disclose a method of removing metal oxide layer by β-diketones. β-diketone vapour is contacted, e.g., with a copper oxide surface where copper β-diketonate and water are formed. Both reaction products are removed from the surface by evaporation and a metal surface is obtained. The process of the publication can not be successfully applied to the production of integrated circuits, since reliability problems occur due to metal contamination of the solid material. Volatile metal compound molecules chemisorb from the vapour phase onto the substrate surfaces surrounding the conductors, from which surface they diffuse into the insulator.

According to the method disclosed in U.S. Pat. No. 6,033,584 $H_2$ plasma treatment can be used for the reduction of copper oxide layer. Although the method can be used even at low temperatures, plasma tends to damage the insulator materials of an IC. Furthermore a plasma generator adds cost and complexity to the overall IC manufacturing process.

It is known that copper oxide can be reduced by hydrogen gas and carbon monoxide. A method of manufacturing semiconductor metal wiring layer by reduction of metal oxide by hydrogen of carbon monoxide has been described in U.S. Pat. No. 5,731,634. Non-activated hydrogen has a rather strong H—H bond which requires either increased process temperatures or additional energy, e.g. in the form of plasma.

M. Utriainen at al. studied the reduction of nickel oxide with hydrogen (Applied Surface Science 157 (2000) pp. 151–158). Nickel may catalyse the breakage of the H—H bond and thus activate hydrogen gas. According to the publication the reduction of NiO could be done at 230° C. in 30 minutes. However, the authors state that the mentioned reduction step induced structural collapse of the thin film and pinholes were formed.

Small molecules such as $H_2$ and CO quickly diffuse inside a metal oxide film and form by-products ($H_2O$ and $CO_2$) inside the film. Due to increased size, these by-products have lower diffusivity towards the surface than the reducing $H_2$ or CO molecules towards the film. Increasing internal pressure may rupture the film and create pinholes. Therefore, the use of $H_2$ or CO as reducing agents is not favourable in the applications of the present invention.

The inventor made comparative experiments with hydrogen and ammonia without a catalyst. Ammonia was selected for making experiments because it is rich in hydrogen. The result was that hydrogen did not reduce copper oxide at 450° C. in one hour (Finnish patent application no. FI20001163). The inventor obtained the same result with gaseous ammonia: copper oxide could not be reduced at a temperature lower than 500° C. IC processing benefits from a simple reduction process of the present invention that works below 400° C. quickly enough (<5 minutes) and does not contaminate insulator surfaces.

Chemical reactions between copper oxide(s) and alcohols, aldehydes and carboxylic acids are known in literature (Gmelin Handbuch der Anorganischen Chemie, Kupfer, Teil B—Lieferung 1, System-Nummer 60, Verlag Chemie, GMBH., 1958). The experiments described in the publication were, however, carried out with copper oxide powder which may have large surface-to-volume ratio due to rough surface and thus is more easily reduced to copper metal than copper oxide in the form of a dense smooth layer is. No reaction conditions were given. Moreover, the publication does not discuss the possibility of using the reduction reaction for making metal thin films or in the process for producing integrated circuits.

EP 0 469 470 A1 discloses a process for reducing copper oxide on printed board. The application concerns copper foil conductors on a printed circuit board. Hydrogen, carbon monoxide or mixtures thereof or hydrazine were used as reducing agents. Platinum metal group metal catalyst is fixed on a copper oxide layer. The catalyst activates the reducing agents at low temperatures. Copper oxide was used to improve the adhesion between copper metal and an insulating laminating (matrix resins) layer. Copper oxide was removed from the copper surface by reduction.

The disadvantage of the method of reducing copper given in EP 0 469 470 A1 is that an activator metal (platinum group) is deposited on the surfaces. The platinum group metals include ruthenium (Ru), rhodium (Rh), palladium (Pd), osmium (Os), iridium (Ir) and platinum (Pt). Depositing a uniform platinum group metal coating on the vias and trenches of damascene structures is a complicated and costly process with PVD and CVD methods.

EP 0 469 470 A1 mentions a generation of reducing gas hydrogen or carbon monoxide) through catalytic pyrolysis of alcohols, aldehydes, carboxylic acids, ammonia and hydrazine. The reducing gas is then contacted with the metal oxide. A disadvantage of the method is that catalytic pyrolysis may form non-volatile carbon-rich fragments from organic compounds that contaminate surfaces. These non-volatile fragments may not harm the functionality of macroscopic contacts (diameter about 0.1–1 mm) in printed circuit boards but these fractions are detrimental to microscopic contacts (diameter about 0.18–0.25 µm) in integrated circuits.

EP 0 469 456 A1 discloses a method of removing copper oxide from copper clad laminates used in printed circuit boards. Reducing gases are generated via catalytic pyrolysis of hydrazine and methylhydrazine. Hydrazine and methylhydrazine are harmful chemicals with carcinogenic and corrosive nature and pyrolysis may generate condensable compounds from methylhydrazine that contaminate sensitive surfaces of ICs. The contact areas made to the copper surface of a printed circuit board are of macroscopic scale (diameter in the order of 0.1–1 mm). The publication does not teach how to apply the invention to the manufacturing of microscopic damascene structures.

A method of liquid-phase removal of copper oxide from copper surfaces is known from WO 93/10652 A1 and DE 41 08 073. The disadvantage of a liquid-phase based method is that metal oxide is reacted into the form of a soluble metal compound that can adhere as a molecular layer to all surfaces exposed to the solution. Furthermore, it is costly to apply the liquid phase removal of metal oxide to a damascene process. For example, after liquid phase removal of copper oxide the substrate must carefully be protected against any exposure to atmosphere that contains oxygen or reactive oxygen compounds before the deposition of a diffusion barrier. Many damascene process steps are preferably done in a cluster tool that only consists of vapour-phase processing units. The copper metal surface provided during the liquid-phase treatment is easily re-oxidised into copper oxide before the substrate arrives in a vapor-phase processing unit. Combining liquid-phase and gas-phase units is complicated and costly. Furthermore, it is difficult to apply the liquid phase treatment to the removal of metal oxide from the via bottoms in damascene and dual damascene structures since the IC substrate should be rinsed and dried carefully in oxygen-free atmosphere and transported in perfectly oxygen-free atmosphere or high vacuum environment to the cluster tool to avoid the re-oxidation of the copper surface.

SUMMARY OF THE INVENTION

It is an aim of the present invention to eliminate the problems of prior art and to provide a novel method of reducing metal oxides into elemental metals during the manufacturing of integrated circuits.

The present invention is based on the finding that during the processing of integrated circuits the reduction of metal oxide(s) to elemental metal can be carried out using reactive organic compounds as a reducing agent. The organic compounds used in the present invention contain at least one functional group selected from the group of alcohol (—OH), aldehyde (—CHO), and carboxylic acid (—COOH).

The present invention concerns a vapour phase process that is easily integrated to process equipment used for the manufacturing of integrated circuit (IC) chips. Preferably the vapour phase process is integrated to a damascene process or a dual damascene process. Applications for making capacitor electrodes and gate metal are also presented.

The present method is applicable for the recovering of the following metal oxide thin films into elemental metal thin films that are shown in Tab. 1.

TABLE 1

| Group of the periodic table of the elements | Oxide | Metal |
| --- | --- | --- |
| Group 6 | $MoO_2$, $MoO_3$ | molybdenum Mo |
| Group 6 | $WO_2$, $WO_3$ | tungsten W |
| Group 7 | $ReO_2$, $Re_2O_5$, $ReO_3$ | rhenium Re |
| Group 8 | FeO, $Fe_2O_3$ | iron Fe |
| Group 8 | $RuO_2$ | ruthenium Ru |
| Group 8 | $OsO_2$ | osmium Os |
| Group 9 | CoO, $Co_3O_4$ | cobalt Co |
| Group 9 | $Rh_2O_3$, $RhO_2$ | rhodium Rh |
| Group 9 | $IrO_2$ | iridium Ir |
| Group 10 | NiO | nickel Ni |
| Group 10 | PdO | palladium Pd |
| Group 10 | $PtO_2$ | platinum Pt |
| Group 11 | $Cu_2O$, CuO | copper Cu |
| Group 11 | $Ag_2O$ (dec. 230° C.) | silver Ag |
| Group 11 | $Au_2O_3$ (dec. 160° C.) | gold Au |
| Group 12 | ZnO | zinc Zn |
| Group 12 | CdO | cadmium Cd |
| Group 13 | $In_2O_3$ | indium In |
| Group 14 | GeO, $GeO_2$ | germanium Ge |
| Group 14 | SnO, $SnO_2$ | tin Sn |
| Group 14 | PbO, $PbO_2$ | lead Pb |
| Group 15 | $Sb_2O_3$, $Sb_2O_4$, $Sb_2O_5$ | antimony Sb |
| Group 15 | $Bi_2O_3$ | bismuth Bi |

The metal oxides listed in Table 1 are formed unintentionally or can be intentionally deposited on a substrate by several ways or methods like PVD or CVD. The vapour pressure of the metal oxides to be reduced is required to be low at the reduction temperature to avoid the evaporation of the metal oxide. According to the present invention the reduction temperature can be less than 400° C., which extends remarkably the group of suitable metal oxides. In some cases the materials used for the IC manufacturing, e.g. porous silicon dioxide as a low-k insulator, withstand higher processing temperatures than 400° C. In these cases the upper reduction temperature limit can be extended to above 400° C., even up to 500° C.

According to the invention of the present application the metal oxide thin film that is to be recovered into a metal thin film consists essentially of a metal oxide or a mixture of metal oxides. The conversion step is done with a gaseous reducing agent capable of arranging a stronger bond to the oxygen in the metal oxide layer than the metal to the oxygen in the said oxide layer. The gaseous reducing agent is capable of taking away the oxygen that was bound to the metal oxide and thus an elemental metal is left on the substrate surface.

Tables 2 and 3 shows which metal oxides are preferably reduced to lower oxides or metals according to the present invention. Preferably one or more of the following reducing agents are used: methanol, formaldehyde, formic acid, ethanol, acetaldehyde, isopropanol. Vapor mixtures can be made when at least two reducing agent chemicals are used at the same time. Experimental work indicates that it is easier to reduce the heavier metal oxides than lighter metal oxides of the selected oxides.

Only the most aggressive reducing agents according to the present invention are able to reduce the oxides given in table 3 into metals or lower oxides.

TABLE 2

Metal oxides to be reduced according to the present invention.

| Unreduced: | Reduced: |
| --- | --- |
| $Ag_2O$ | Ag |
| $Au_2O_3$ | Au |
| CoO | Co |
| $Co_3O_4$ | CoO |
| $Cu_2O$ | Cu |
| CuO | $Cu_2O$ |
| FeO | Fe |
| $Fe_2O_3$ | FeO |
| $IrO_2$ | Ir |
| $MoO_2$ | Mo |
| $MoO_3$ | $MoO_2$ |
| NiO | Ni |
| $OsO_2$ | Os |
| $OsO_4$ | $OsO_2$ |
| PdO | Pd |
| $PtO_2$ | Pt |
| $ReO_2$ | Re |
| $ReO_3$ | $ReO_2$ |
| $Re_2O_7$ | $ReO_3$ |
| $Rh_2O_3$ | Rh |
| $RuO_2$ | Ru |
| $RuO_4$ | $RuO_2$ |
| $WO_2$ | W |
| $WO_3$ | $WO_2$ |

TABLE 3

Metal oxides to be reduced with the most aggressive reducing agents according to the present invention.

| Unreduced: | Reduced: |
| --- | --- |
| $Bi_2O_3$ | Bi |
| CdO | Cd |
| GeO | Ge |
| $GeO_2$ | GeO |
| $In_2O_3$ | In |
| $PbO_2$ | PbO |
| PbO | Pb |
| $Sb_2O_3$ | Sb |
| $Sb_2O_4$ | $Sb_2O_3$ |
| $Sb_2O_5$ | $Sb_2O_4$ |
| SnO | Sn |
| $SnO_2$ | SnO |
| ZnO | Zn |

More specifically, the process according to the present invention is characterised by what is stated in the characterising part of claim 1.

A number of considerable advantages are obtained with the aid of the present invention.

The present reduction method utilises cheap reducing chemicals. Processing temperatures are relatively low and there is no need for additional energy, e.g. in the form of plasma.

Due to low processing temperatures the present process is extremely advantageous for the production of integrated circuits. The rate of the reduction of metal oxide(s) to elemental metal is high. The rate of reduction depends on the thickness of the metal oxide layer to be reduced. Experiments show that a 400-nm thick copper oxide layer was reduced into pure copper metal in five minutes at temperatures as low as 310° C.

The amount of carbon and hydrogen impurities and oxygen in the reduced metal film is low. Thus, the present invention provides a unique combination of low processing temperature, short operation time and low level of carbon and hydrogen impurities in the produced thin films.

The present invention is based on the reduction of metal oxide into elemental metal. Source chemicals used in the present invention do not form volatile metal compounds; they react with the metal oxide forming only elemental metal and volatile metal-free by-products which are purged or pumped away from the substrate surface. Therefore, the method of the present invention does not result in metal compound contamination of the insulator surfaces of the IC device.

The present invention provides a simple one-step reduction process for eliminating iminating metal oxide and utilises cheap, commercially available source chemicals that can be vaporised without additional physical or chemical pre-processing such as pyrolysis or catalysis. Furthermore, complicated liquid phase treatment of the substrate is not needed.

The present invention utilises simple liquid source chemicals that can be handled safely and evaporated easily into gaseous form before the reaction space where the metal oxide reduction takes place.

According to the present invention a reducing agent with relatively bulky molecules (alcohols, aldehydes and carboxylic acids) are used. Bulky source chemical molecules do not easily diffuse inside the metal oxide film. The reduction reaction takes place only at the surface of the metal oxide layer. It is expected that during the reduction process oxygen ions diffuse towards the surface where oxygen is depleted by the reducing chemicals. Gaseous by-products are not formed inside the film but only on the surface. Structural integrity of the forming metal film is preserved and no pinholes will form on the film.

When compared with a process using hydrogen as the reducing agent, it was found that the present process provides the desired reduction at much lower temperatures and with shorter process time than a process utilising molecular hydrogen gas.

The invention can be used for reducing an insulating or semiconducting metal oxide layer on electrically conducting surfaces, in particular in damascene and dual damascene structures in integrated circuits. Thus, the metal oxide layer formed on the surface of the copper metal layer in the bottom of vias and/or trenches is reduced at least partly to metal with an organic reducing agent according to the present invention agent before the deposition of a diffusion barrier. Preferably the said metal is copper.

Further, the present invention provides means for depositing a seed layer for electrochemical deposition of copper in damascene or dual damascene structures of integrated circuits. A thin copper or other metal oxide layer deposited by any suitable method (e.g. an ALD method) is reduced at least partly to copper or other metal which then acts as the seed layer for the deposition of copper that fills trenches and vias on the substrate. The present invention also provides means for forming capacitor electrodes and gate metal with good adhesion to the surrounding materials.

In the following, the present invention is disclosed in more detail with the aid of a detailed description and by making reference to the attached drawings.

DETAILED DESCRIPTION OF THE DRAWINGS

FIGS. 1 to 7 are described in the experiments in more detail.

Figure 8:
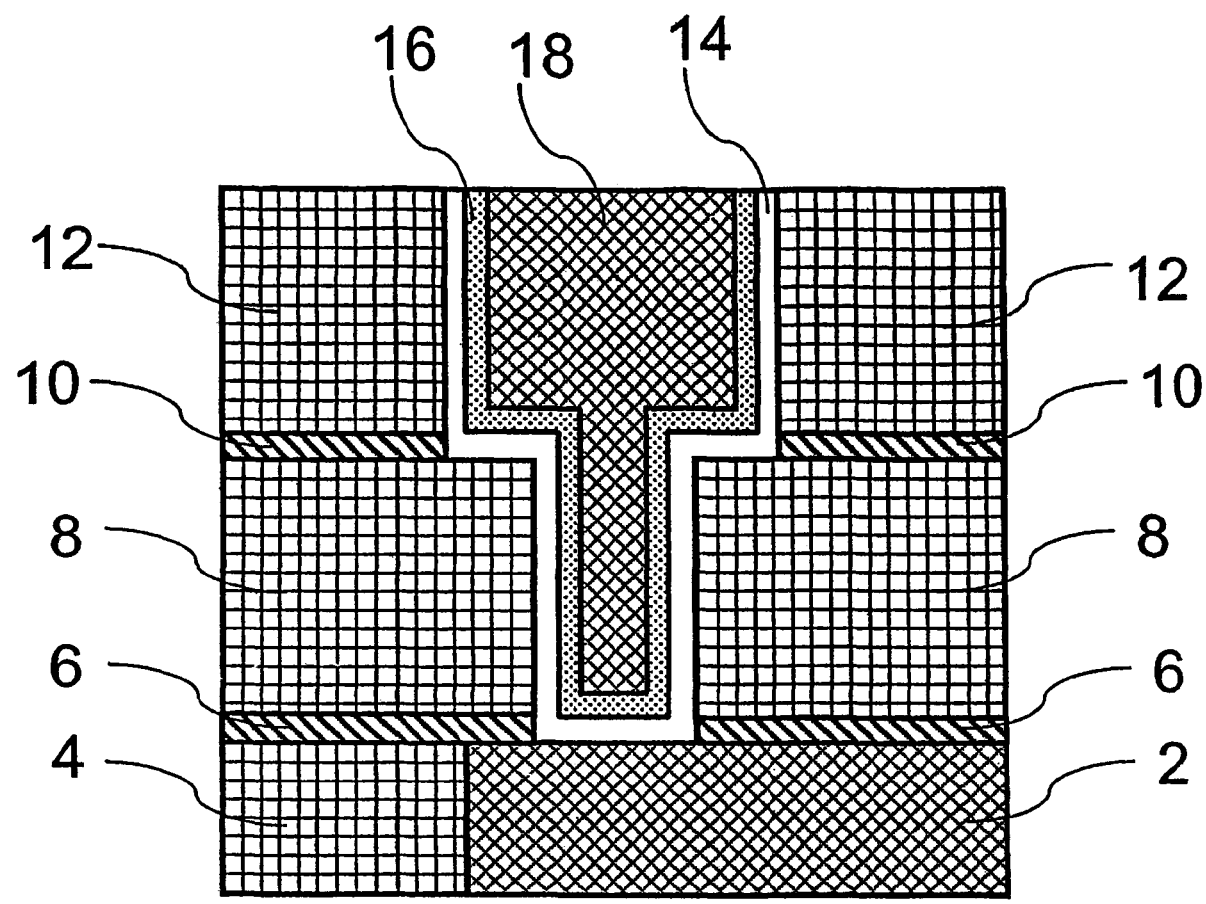
FIG. 8 is a schematic view of the dual damascene structure.

The dual damascene structure shown in FIG. 8 consists of a previous metallization layer 2 e.g. Cu, an insulating layer 4 e.g. $SiO_2$, a via etch stop 6 made of $Si_3N_4$, a via level insulator 8 e.g. $SiO_2$, a trench etch stop 10 made of $Si_3N_4$, a trench level insulator 12 e.g. $SiO_2$, a diffusion barrier 14 e.g. TaN, a seed layer 16 and a via/trench fill metal 18 e.g. Cu.

Figure 9:
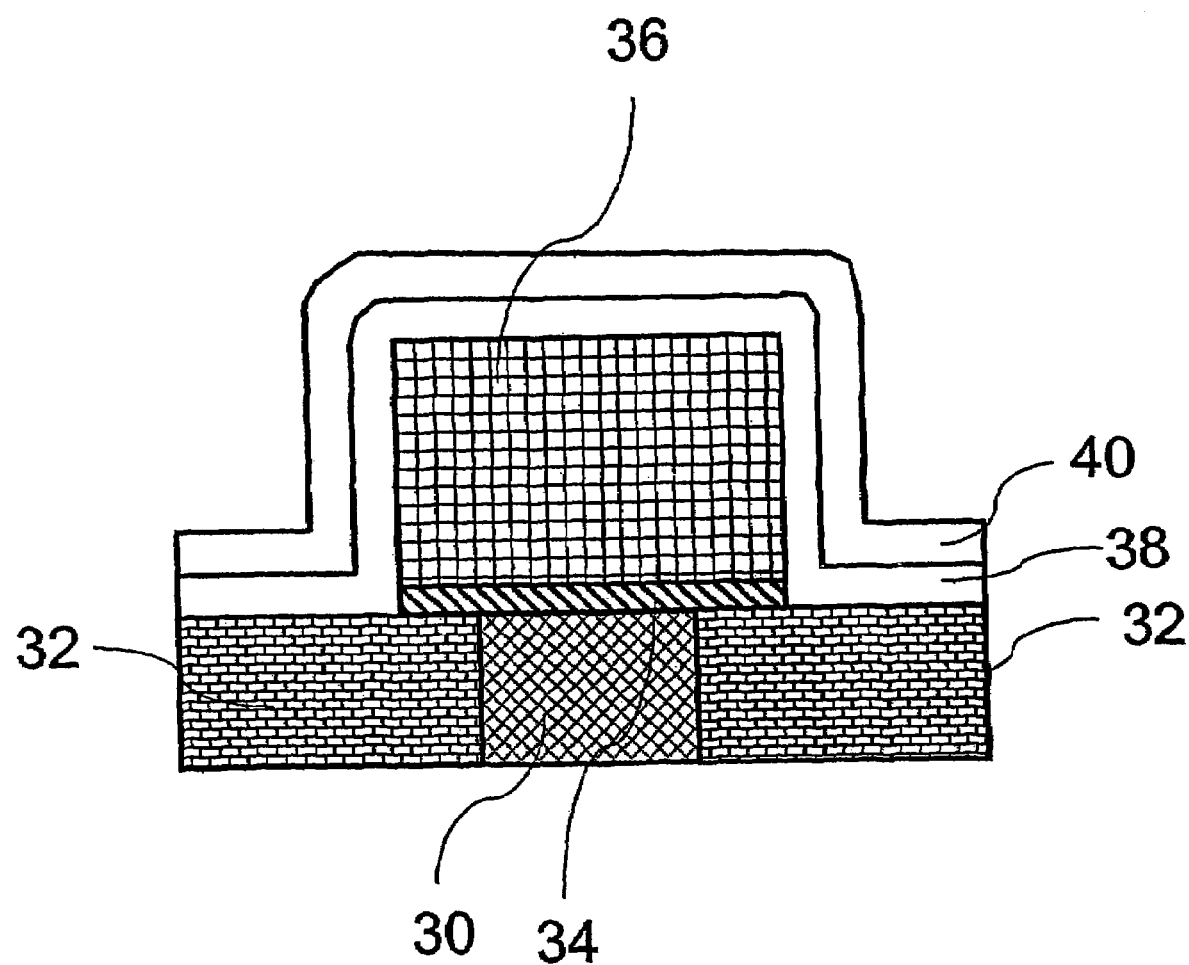
FIG. 9 is a schematic view of a capacitor structure.

The capacitor structure shown in FIG. 9 consists of a contact plug 30 e.g. tungsten W or polysilicon, an insulator 32, an optional diffusion barrier 34 e.g. TiN, a lower electrode 36 e.g. Ru, Pt or $RuO_2$, a high-k dielectric film 38 e.g. barium strontium titanate (BST) and an upper electrode 40 e.g. Ru or Pt.

Figure 10:
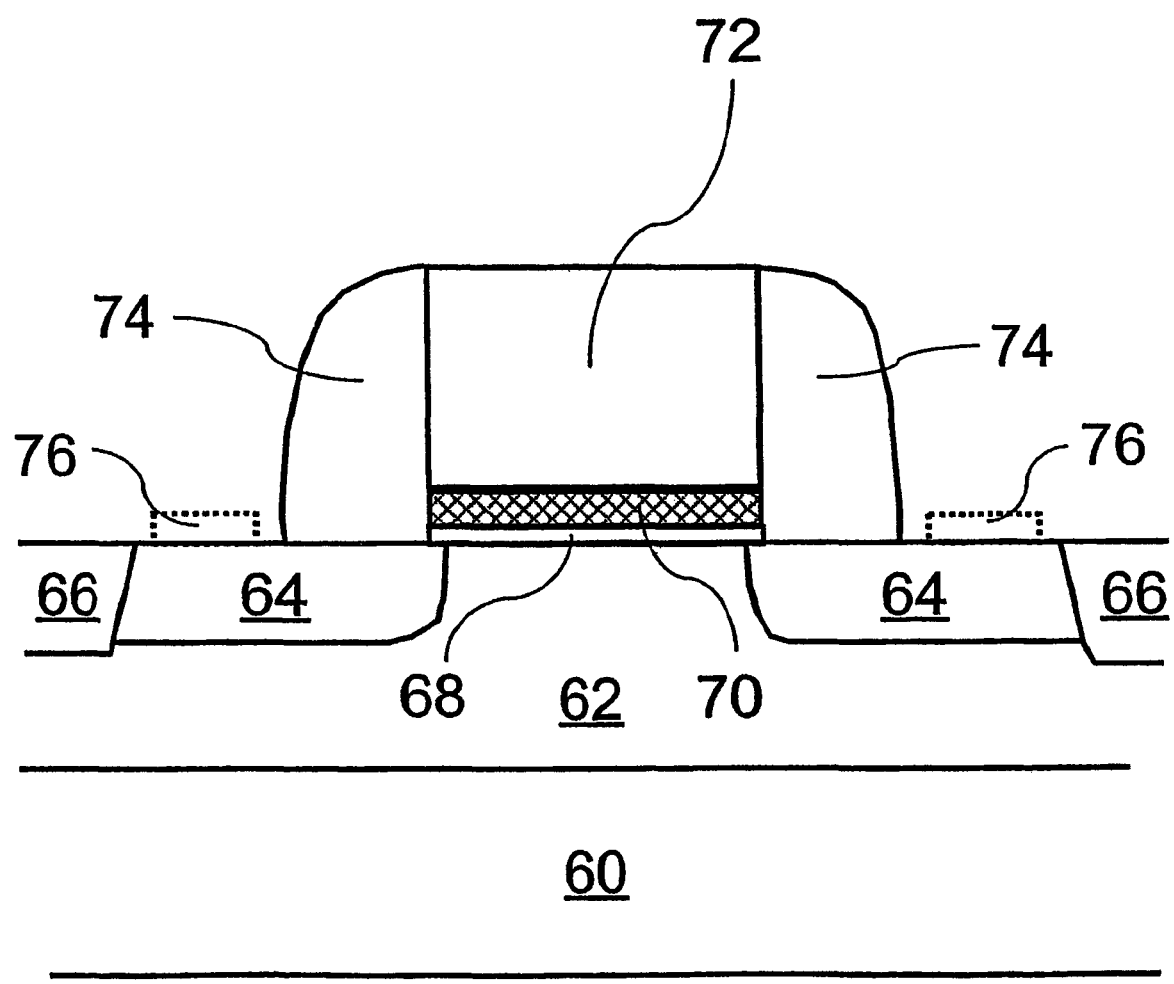
FIG. 10 is a schematic view of an NMOS transistor suitable for CMOS structures.

The partial transistor structure shown in FIG. 10 consist of a substrate 60, an n-type well 62, a p-type diffusion region 64 (right drain, left source), a shallow trench isolation oxide 66, a gate dielectric 68, an optional barrier layer 70, a gate metal 72, a gate isolation spacers 74 and contact areas for tungsten plugs 76. The contact areas are dotted because they are not in the same vertical plane with the other numbered parts. A CMOS structure contains both PMOS and NMOS transistors. The contact areas against P-type semiconductor can be made of e.g. Ni and RuO. The contact areas against N-type semiconductor can be made of e.g. Ru. Platinum can also be applied under W plugs. The choice of the metal or electrically conductive metal compound depends on the work function of the underlying layer and the reactivity of the surrounding materials with the said metal or electrically conductive metal compound.

DETAILED DESCRIPTION OF THE INVENTION

The production of integrated circuits is a complicated process with numerous steps which can be carried out in several different ways. The present process can be used in connection with various processes, if only the resulting IC consists at least one conductive metal layer which during the processing of the IC is at least partly in the form of metal oxide.

In general, the structure of an IC comprises layers of different materials having different properties, different areas and, thus, also different functions in the structure. The layers are produced by any deposition method known per se. Preferred deposition methods include atomic layer deposition (ALD), chemical vapour deposition (CVD) and, particularly in the case of deposition of copper metal layer, electrochemical deposition (ECD). Examples of layers in an IC structure are a dielectric layer and a diffusion barrier layer. The insulation layer is needed to electrically separate the conductive layers from each other. The diffusion barrier layer, which is electrically conductive, is needed to prevent the diffusion of copper or other metal from interconnects into insulators or active parts of the device. On the other hand, the diffusion barrier layer prevents the diffusion of oxygen or other harmful elements to the metal layer.

According to the present invention, a process for producing an integrated circuit typically comprises at least the following steps:

depositing on a substrate containing at least one metal layer at least one first layer capable of stopping a treatment for removing a dielectric from going further in the structure, depositing on said layer at least one first dielectric layer, depositing at least one second layer capable of stopping a treatment for removing a dielectric from going further in the structure, depositing on said layer at least one second dielectric layer, forming vias and/or trenches in the thus formed structure, whereby the metal layer on the substrate is at least partly exposed and oxidised, reducing the oxidised metal layer at least partly to metal with a reducing agent selected from the group of organic compounds containing one or more of the following functional groups: alcohol (—OH), aldehyde (—CHO), and carboxylic acid (—COOH), preferably depositing at least one diffusion barrier layer on said deoxidised metal surface, and preferably depositing a metal layer of desired thickness on said diffusion barrier layer.

The above steps are repeated until a structure having the desired properties is formed. Typically, in an IC structure, the above cycle is repeated 5–6 times. Prior to starting the next cycle, the surface of the deposited metal layer is planarised to the upper surface level of the second dielectric layer, and, preferably, a diffusion barrier or etch stop layer is deposited on said planarised copper layer.

By "metal (oxide) layer", and layer in general, is in the context of the present invention meant a layer which is grown from elements or compounds that are transported as separate ions, atoms or molecules via vacuum, gaseous phase or liquid phase from the source to the substrate. The choice of a deposition method for making a layer does not limit the applicability of the present reduction process. The thickness of the layer varies in a wide range, e.g., from one molecular layer to 800 nm up to 1000 nm and even more.

One of the most advanced IC structure is so called dual damascene structure which consists of a silicon substrate with transistors (source, gate and drain) on it. Only the first metallization level is done with tungsten plugs and aluminum interconnects to prevent the contamination of the gate with copper. The rest of the metallization levels are made of copper.

A more detailed example about the formation of metallisation layers and interconnects with a dual damascene method is presented below. The details and the number of process steps may vary, but the general idea is largely the same.

Step 1. A silicon nitride etch stop is grown on the previous metallization surface.

Step 2. A via level dielectric is deposited.

Step 3. Another silicon nitride etch stop is deposited.

Step 4. A trench level dielectric is deposited. $SiO_2$ has been favoured as the dielectric material. Low-k material such as nitrided silicon oxide and polymers as well as porous insulators have been experimented as an alternative dielectric material.

Step 5. Patterning of dielectric by photolithography.

A resist layer is deposited on dielectrics surface.

The resist layer is patterned and the resist is removed from the via areas.

Dielectrics is etched from the via areas with directional plasma. Etching terminates at the silicon nitride surface.

Resist is stripped from the surface.

Step 6. Patterning of the etch stop layer by photolithography.

A second resist layer is deposited on the surface.

The resist layer is patterned and it is removed from the trench areas.

Silicon nitride is removed with a short plasma nitride etch from the bottom of the holes that were made with the first plasma oxide etch.

The second plasma oxide etch removes silicon dioxide from the exposed via and trench areas until the silicon nitride etch stop is reached.

The first silicon nitride etch stop is removed from the via bottom and the second silicon nitride etch stop from the trench bottom with a short plasma nitride etch.

Resist is stripped from the substrate.

Step 7. A diffusion barrier layer is grown on all exposed surfaces.

Step 8. A seed layer for copper deposition is grown with CVD or PVD on the diffusion barrier layer.

Step 9. Vias and trenches are filled with copper by an electroplating process.

Step 10. The substrate surface is planarized with chemical mechanical polishing (CMP). The surface is polished until there is copper and a barrier layer left only in trenches and vias.

Step 11. The surface is capped with a silicon nitride etch stop layer.

Step 12. The metallization process is then repeated for all the remaining metallization levels.

The form and number of the trenches and vias formed to the structure are selected to match the production objective.

As the resist layer is removed as presented above, the copper layer, which is at corresponding points subjected to the ozone treatment, is oxidised at least partly, thus forming copper oxide. This copper oxide layer is, according to the present invention, then essentially totally or at least partly reduced to copper metal. The undesired oxidation of metal may occur during the production of an IC structure at different process stages, and the present process is advantageously used for the reduction of the copper oxide layer at least partly to copper metal in any or all of these stages.

Depending on the desired structure, the number of metal layers in an IC structure can be from one up to two, three, four or even six or more. For example, a copper layer (copper plug) is typically deposited on the surface of the diffusion barrier layer in the bottom of vias and in trenches. The reduction process of the present invention can be used in connection with the deposition of any or all of the metal layers of an IC structure.

According to a first embodiment of the present invention a copper layer needed as an interconnect in an IC structure is deposited by growing a copper oxide layer of desired thickness on the substrate by any suitable method, and then reducing it to copper metal layer with the reducing agents used in the process of the present invention.

According to a second preferred embodiment of the present invention, a seed layer for the deposition of a copper layer (cf process step 8) on a substrate is formed by first depositing by any suitable method a thin copper oxide layer having a thickness typically in the range of 0.1–10 nm. Said copper oxide layer is then reduced at least partly to copper metal, and, thereafter, a copper metal layer can be deposited by any suitable method. Thus, the methods used for depositing the copper oxide layer and the copper metal layer can be selected independently.

The substrate used in the present process is typically silicon, although also other alternatives can be used. It is to be understood that in the case where a second, third, etc. metal layer or metal oxide layer is deposited, "the substrate" is typically the diffusion barrier layer previously deposited. Thus, the substrate can also comprise materials like amorphous transition metal nitrides, such as TiN, TaN and WN.

As already discussed, the metal oxide layer to be reduced can be, for example, intentionally deposited layer of metal oxide or it can be the result of an undesirable oxidation of metal in the form of native oxide. Thus, the chemical structure and the oxygen content in the layer to be reduced can vary widely. Typically, it is in the range of 5 to 75 at-%, and in particular from 33 to 50 at-%.

The thickness of the layer to be reduced is typically in the range of 0.1 to 1000 nm. It is easily understood that in the cases where the layer to be reduced is a layer of native oxide resulting from undesired oxidation of the surface metal, the thickness of the layer is typically less than in the cases where a relatively thick layer of oxide is deposited on a substrate and then reduced to metal. The thickness of the native oxide layer formed on a metal layer is typically in the range of 0.1 to 100 nm, in particular from 0.1 to 50 nm. On the other hand, it is possible to reduce a metal oxide layer of 100 to 1000 nm, in particular 300 to 500 nm to metal.

The reduction process is preferably carried out in a reaction space which enables controlled temperature, pressure and gas flow conditions. Both low-pressure and atmospheric pressure reactors can be used for the reduction process.

The substrate containing the metal layer to be reduced is placed in a reaction space, and the reaction space is preferably evacuated to vacuum. The organic reducing agent is vaporised and fed to the reaction space, optionally with the aid of an inert carrier gas, such as nitrogen. The reducing agent is contacted with the substrate, whereby the metal oxide layer is reduced at least partly to metal and the reducing agent is oxidised. Typically, the reaction space is then purged with an inert carrier gas to remove the unreacted organic reducing agent and reaction products.

The reduction process according to the present invention is carried out at low temperatures. Theoretically, the reactions between oxide(s) and the reducing agents used in the process of the present invention are favourable in a wide temperature range, even as low as room temperature. Kinetic factors and the diffusion rate of oxygen to the thin film surface set a lower limit to the actual process temperatures that can be applied successfully. The temperature in the reaction space is typically in the range of 250 to 400° C., in some cases, substrate materials permitting, up to 500° C., preferably 300 to 400° C. and in particular 310 to 390° C. In case of very thin metal oxide thin films, in the order of about 0.1–10 nm, the reduction can be done even below 250° C.

The pressure in the reaction space is typically 0.01 to 20 mbar, preferably 1 to 10 mbar.

The processing time varies according to the thickness of the layer to be reduced. A layer of copper oxide having a thickness up to 300–400 nm can be reduced in approximately 3 to 5 minutes. For layers having a thickness of approximately 0.1–10 µm, the processing time is in the order of seconds.

Examples of suitable arrangements are reactors used for deposition of thin films by ALD and/or CVD. The reduction process can also be done in a cluster tool where the substrate arrives from a previous process step, the substrate is treated with the reducing agent and finally transported to the following process step. In a cluster tool the reaction space temperature can be kept constant, which improves clearly the throughput when compared to a reactor which is heated to the process temperature before each run.

A stand-alone reactor can be equipped with a load-lock. In that case it is not necessary to change the temperature of the reaction space between runs.

The amount of impurities present in the reduced copper layers is low. The amount of H and C impurities is typically in the order of 0.1 to 0.2 at.-%. The amount of residual oxygen is typically in the range of 0.1 to 1 at-%, in particular 0.2 to 0.5 at-%.

According to third embodiment of the present invention a seed layer for electrochemical deposition of a metal layer is formed. An IC substrate with open trenches and vias is provided into an ALD or CVD reaction chamber. A diffusion barrier layer 14 with a metal oxide layer 16 on it has been provided on the substrate earlier. The metal oxide 16 an be selected from a group of $ReO_2$, $Re_2O_7$, $ReO_3$, $RuO_2$, $OSO_2$, $CoO$, $CO_3O_4$, $Rh_2O_3$, $RhO_2$, $IrO_2$, $NiO$, $PdO$, $PtO_2$, $Cu_2O$, $CuO$, $Ag_2O$ and $Au_2O_3$ or mixtures thereof. A person skilled in the art understands that the reduction process is not limited to the said metal oxides because the stoichiometry may vary in metal oxides.

The pressure of the reaction chamber is adjusted to about 5–10 mbar with a vacuum pump and flowing nitrogen gas. The metal oxide film is converted into a metal layer and used as a seed layer 16 for an electroplating process.

According to fourth embodiment of the present invention the metal layer is annealed before chemical mechanical polishing (CMP) in an atmosphere that contains a reducing agent in gaseous form selected from chemicals that contain at least one —OH, —CHO and/or —COOH functional group. The annealing performed before the CMP step is called pre-CMP annealing. The reducing agent can be a gaseous mixture of at least two chemicals that contain at least one —H, —CHO and/or —COOH functional group. The reducing agent gas can be diluted with inactive gas, e.g. nitrogen gas.

After the vias and trenches of the IC containing substrate are filled with electrochemically plated copper 18, a standard procedure of annealing follows. Annealing improves the physical and mechanical properties of the copper layer and therefore increases the polishing rate and improves the uniformity of the polishing. Since oxygen that is dissolved in the copper layer disturbs the grain growth of copper, it is advantageous to anneal the copper layer according to the present invention in a reducing atmosphere. The reducing agent gas can be diluted with inactive gas, e.g. nitrogen or argon. The reduction temperature is preferably below 400° C.

According to fifth embodiment of the present invention the metal oxide is reduced into elemental metal after the post-CMP cleaning. Submicrometer particles are cleaned from the surface of the device after chemical mechanical polishing which process is called post-CMP. However, some copper oxide may still be left on the copper metal surface. A metal oxide coating on the metal surface impairs the adhesion between the metal layer and the thin film, e.g. an etch stop layer, which is deposited on top of the metal layer. Therefore it is advantageous to carry out the reduction step according to the present invention after the post-CMP process. A gaseous reducing agent is contacted with the substrate preferably below 400° C., the reducing agent being selected from organic compounds that contain at least one —OH, —CHO and/or —COOH functional group or from gaseous mixtures of said organic compounds.

According to sixth embodiment of the present invention metal oxide layer unintentionally formed on a via bottom is reduced. After the silicon nitride etch stop is removed from the via bottom and resist is stripped from the substrate metal oxide can be formed on the exposed metal on the bottoms of the vias. The metal oxide must be eliminated by reducing it in order to provide low contact resistance between the copper and the adjacent diffusion barrier thin film. A gaseous reducing agent is contacted with the substrate preferably below 400° C., the reducing agent being selected from organic compounds that contain at least one —OH, —CHO or —COOH functional group or from gaseous mixtures of said organic compounds.

According to seventh embodiment of the present invention an IC substrate with a reducible metal oxide layer on the surface is provided into a reaction chamber of a CVD reactor. The substrate is heated to a deposition temperature. The metal oxide is converted into corresponding metal and used as the first electrode 36. Then a thin film of a high-k dielectric material 38 is grown on the first electrode 36. The high-k layer 38 is optionally annealed. Metal oxide film is grown on the high-k layer with a known deposition method, e.g. with PVD or CVD or with ALD according to a pending patent application. According to the present invention, the metal oxide film is converted into corresponding elemental metal with a gaseous reducing agent selected from organic compounds that contain at least one OH, —CHO or —COOH functional group or with a mixture of two or more gaseous compounds of said reducing agents, optionally diluted with an inactive gas, e.g. nitrogen gas. The metal layer formed thereof is used as the second electrode 40 of the capacitor.

According to eighth embodiment of the present invention a substrate with reducible metal oxide on the surface is provided into a reaction chamber of a CVD reactor. Under the reducible metal oxide there may be, for example, transistor gate oxide 68 or doped silicon on source and drain areas 64. The substrate is heated to a reduction temperature, which is preferably less than 400° C. The metal oxide is reduced into corresponding metal with a reducing agent selected from organic compounds that contain at least one OH, —CHO or —COOH functional group or from gaseous mixtures of said organic compounds. The metal formed thereof is used as the gate electrode of a transistor. The said metal can also be used as an intermediate layer 76 between silicon and tungsten plugs on the source and the drain areas of the transistor.

According to ninth embodiment the present invention is applied to a back end assembly of ICs employing copper wire and/or copper bonding pads. Since multi-level copper interconnects at the wafer level are becoming more common, more cost effective process and handling protocols that provide consistent, highly reliable interconnection between the pads and the package, regardless of the bonding wire employed are needed.

During IC manufacturing processes wafers with copper bonding pads are exposed to processes that promote the formation of copper oxides on the surface. Such processes are for example wafer dicing, die attach epoxy curing and wire bonding. The metal oxide formed thereof is recovered to a metallic form by means of the present invention.

The wafer dicing involves submerging the entire wafer surface in water during a high speed cutting operation where a diamond particle impregnated wheel spinning at high speed of rotation is used. Heat is generated at the cut line and the temperature of the silicon rises promoting the formation of oxide on the copper pad surface.

Organic materials such as epoxies loaded with silver flakes or silver powder are used to attach an individual dice to the die attach pad of the substrate. It is necessary to cure the epoxy based material and various heat profiles utilized. The highest temperature typically used does not exceed 250° C. The curing atmosphere may be either nitrogen or clean dry air. The devices typically do not undergo any significant cooling before being exposed to room air. The oxides formed at this point may also incorporate some carbon as there are solvents that outgas during the curing process and may redeposit on the surfaces during the oxidation process. The composition of such redeposits is not well defined at this time.

During the preheating step of the wire bonding the substrates are exposed to temperatures from 130° C. to 175° C. for varying periods of time. The entire track system of the bonder may or may not be equipped with an inert gas environment. Therefore, oxides may generate during this phase of the bonding process.

Various types of materials are used as substrates of an IC device. The substrate often consists of a copper alloy (A194, 7025C, EFTEC64T) and has silver stripes that are electroplated in well-defined areas. The plating may also consist of a complete plating of gold over palladium over nickel. Other substrate materials are organic in nature and are often made of a BT resin. Upon these substrates there is a patterned series of metal traces for signal management. The base material is copper covered with nickel and gold. Most of the nickel- and gold-covered copper is covered with an organic material in the form of a solder mask.

It is important to ensure that the die attach epoxy, electroplating, organic substrates and solder mask are not degraded by any cleaning process.

Currently only organic substrates are routinely cleaned in an oxygen plasma to remove residues from the gold plating. Some work published by http://www.semiconductorfabtech.com indicates that a hydrogen/argon plasma is suitable for cleaning oxides from copper bonding pads. Details of the actual cleaning process were disclosed in a paper (Nico Onda, Zeno Stossel et al., "Hydrogen plasma cleaning a novel process for IC-packaging").

The process derived from this proprietary chemistry of the present invention should be capable of removing not only oxide from the copper pads but from the leadframe itself. On leadframes there can be silver plated areas that contain silver oxide on metal surface. There is strong push in the industry that wants to abandon plating on leadframes if copper wire is used in the bonding process. This is being driven from a cost point of view. This requires both a robust oxide removal process and a wire bonding system that can prevent re-oxidation. The latter part we are now capable of doing. The process and hardware must provide cycle times of less than one minute per frame to compete with equivalent plasma processes. The system cost must also be low and MTBA/MTTR must be in line with other assembly equipment. Also there must be long intervals between routine maintenance. The maintenance time must be short and low cost also.

According to tenth embodiment of the present invention nickel oxide on nickel plated surfaces, silver oxide on silver plated surfaces and copper oxide on copper surfaces that are related to wire bonding pads on dices and leadframes are reduced by means of the present invention. After epoxy has been applied to the dices, high temperatures should be avoided; therefore the applied reduction temperature must be very low, around 150° C.

The thickness of oxide layer on metal pads varies from a wafer lot to another. The reducing method according to the eleventh embodiment of the present invention consists of a two-step reduction process. The first reduction step homogenizes wafer lots by diminishing the variation of the thickness of the metal oxide layers on the bonding pads. The first reduction step can be done at temperatures below 400° C. When a wafer has been diced and the dice has been attached to the centre of a leadframe the second reduction step takes place. The remaining thin layer of a metal oxide (typically copper oxide) on the bonding pads is reduced into elemental metal at around 150° C. A reducing agent is a an organic compound that contains at least one —OH, —CHO and/or —COOH functional group or a mixture of said organic compounds. The reducing agent is evaporated, optionally diluted with an inactive gas, e.g. nitrogen gas, introduced to the reaction space and contacted with the substrate surface that contains the reducible metal oxide.

The Reducing Agents

The reducing agents are selected from materials having sufficient vapour pressure, sufficient thermal stability at a substrate temperature and sufficient reactivity with the metal oxide to be reduced.

Sufficient vapour pressure means that there should be enough source chemical molecules in the gas phase near the substrate surface to enable fast enough reduction reactions.

In practice, sufficient thermal stability means that the reducing agent itself should not form growth isturbing condensable phases on the substrates or leave harnflil levels of impurities on the substrate surface through thermal decomposition. Thus, one aim is to avoid non-controlled condensation of molecules on substrates.

Further selecting criteria include the availability of the chemical at sufficiently high purity, and the ease of handling, inter al., without severe precautions.

According to the present invention, the reducing agents are selected from organic compounds satisfying the above criteria. The organic compounds used in the reduction according to the present invention have at least one functional group selected from the group of alcohol (—OH), aldehyde (—CHO), and carboxylic acid (—COOH).

Suitable reducing agents containing at least one alcohol group are preferably selected from the group of primary alcohols which have an —OH group attached to a carbon atom which is bonded either to hydrogen (as in CH$_3$OH) or to one other carbon atom, in particular primary alcohols according to the general formula (I)

$$R^1\text{—OH} \tag{I}$$

wherein R$^1$ is a linear or branched C$_1$–C$_{20}$ alkyl or alkenyl group, preferably methyl, ethyl, propyl, butyl, pentyl or hexyl, examples of preferred primary alcohols being methanol (CH$_3$OH), ethanol (CH$_3$CH$_2$OH), propanol (CH$_3$CH$_2$CH$_2$OH), butanol (CH$_3$CH$_2$CH$_2$CH$_2$OH), 2-methyl propanol ((CH$_3$)$_2$CHCH$_2$OH) and 2-methyl butanol (CH$_3$CH$_2$CH(CH$_3$)CH$_2$OH), secondary alcohols which have an —OH group attached to a carbon atom which is bonded to two other carbon atoms, in particular secondary alcohols according to formula (II)

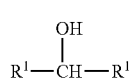

(II)

wherein each R$^1$ is selected independently from the group of linear or branched C$_1$–C$_{20}$ alkyl and alkenyl groups, preferably methyl, ethyl, propyl, butyl, pentyl and hexyl, examples of suitable secondary alcohols being 2-propanol ((CH$_3$)$_2$CHOH) and 2-butanol (CH$_3$CH(OH)CH$_2$CH$_3$), tertiary alcohols which have an —OH group attached to a carbon atom which is bonded to three other carbon atoms, in particular tertiary alcohols according to the general formula (III)

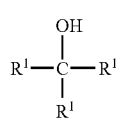

(III)

wherein each R$^1$ is selected independently from the group of linear or branched C$_1$–C$_{20}$ alkyl and alkenyl groups, preferably methyl, ethyl, propyl, butyl, pentyl and hexyl, an example of suitable tertiary alcohol being tert-butanol ((CH$_3$)$_3$COH), polyhydroxy alcohols, such as diols and triols, which can have primary, secondary and/or tertiary alcohol groups as presented above, for example ethylene glycol (HOC$_2$CH$_2$OH) and glycerol (HOCH$_2$CH(OH)CH$_2$OH), cyclic alcohols which have an —OH group attached to at least one carbon atom which is part of a ring of 1–10, typically 5–6 carbon atoms, aromatic alcohols having at least one —OH group attached either to the benzene ring or to a carbon atom in a side-chain, such as benzyl alcohol (C$_6$H$_5$CH$_2$OH), o-, p- and m-cresol and resorcinol, halogenated alcohols, preferably having the general formula (IV)

$$CH_nX_{3-n}\text{—}R^2\text{—OH} \tag{IV}$$

wherein X is F, Cl, Br or I, preferably F or Cl, n is an integer from 0 to 2, and R$^2$ is selected from the group of linear or branched C$_1$–C$_{20}$ alkylene and alkenylene groups, preferably methylene, ethylene, trimethylene, tetramethylene, pentamethylene and hexamethylene, and in particular methylene and ethylene, an example of a suitable compound is 2,2,2-trifluoroethanol (CF$_3$CH$_2$OH), and other derivatives of alcohols, for example amines, such as methyl ethanolamine (CH$_3$NHCH$_2$CH$_2$OH).

Suitable reducing agents containing at least one —CHO group are preferably selected from the group of compounds having the general formula (V)

$$R\text{—CHO} \tag{V}$$

wherein R$^3$ is hydrogen or linear or branched C$_1$–C$_{20}$ alkyl or alkenyl group, preferably methyl, ethyl, propyl, butyl, pentyl or hexyl, in particular methyl or ethyl, examples of suitable compounds according to formula (V) are formaldehyde (HCHO), asetaldehyde (CH$_3$CHO) and butyraldehyde (CH$_3$CH$_2$CH$_2$HO), alkanedial compounds having the general formula (VI)

$$OHC\text{—}R^4\text{—}CHO \tag{VI}$$

wherein R$^4$ is a linear or branched C$_1$–C$_{20}$ saturated or unsaturated hydrocarbon, but it is also possible that R$^4$ is zero, i.e., the aldehyde groups are bonded to each other, halogenated aldehydes, and other derivatives of aldehydes.

Suitable reducing agents containing at least one —COOH group are preferably selected from the group of compounds having the general formula (VII)

$$R^5\text{—COOH} \tag{VI}$$

wherein R$^5$ is hydrogen or linear or branched C$_1$–C$_{20}$ alkyl or alkenyl group, preferably methyl, ethyl, propyl, butyl, pentyl or hexyl, in particular methyl or ethyl, examples of suitable compounds according to formula (VI) being formic acid (HCOOH) and acetic acid (CH$_3$COOH), polycarboxylic acids, halogenated carboxylic acids, and other derivatives of carboxylic acids.

In the reduction of a metal oxide, the reducing agent naturally oxidises Thus, of the reducing agents used in the present invention, the alcohols are oxidised into aldehydes and ketones, the aldehydes are oxidised into carboxylic acids and the carboxylic acids into carbon dioxide. Water is formed in some reactions as a gaseous by-product. It is important to select the reducing agents so that the oxidised reducing agents are volatile and can, thus, be easily removed from the reaction space after the reaction.

In the following, the present invention is further illustrated with the aid of working examples.

EXAMPLES

The properties of the thin films were determined by following methods:

Resistance was measured with a Hewlett Packard 34401A multimeter. Four leads were connected to two gold-plated contact pins. The arrangement enabled the elimination of the lead resistance. The distance between the pin tips was 13.5 mm. During the measurement, the pins were carefully pressed on sample surface with a 190 g mass. The set-up was used for a comparative analysis between the samples.

Figure 7:
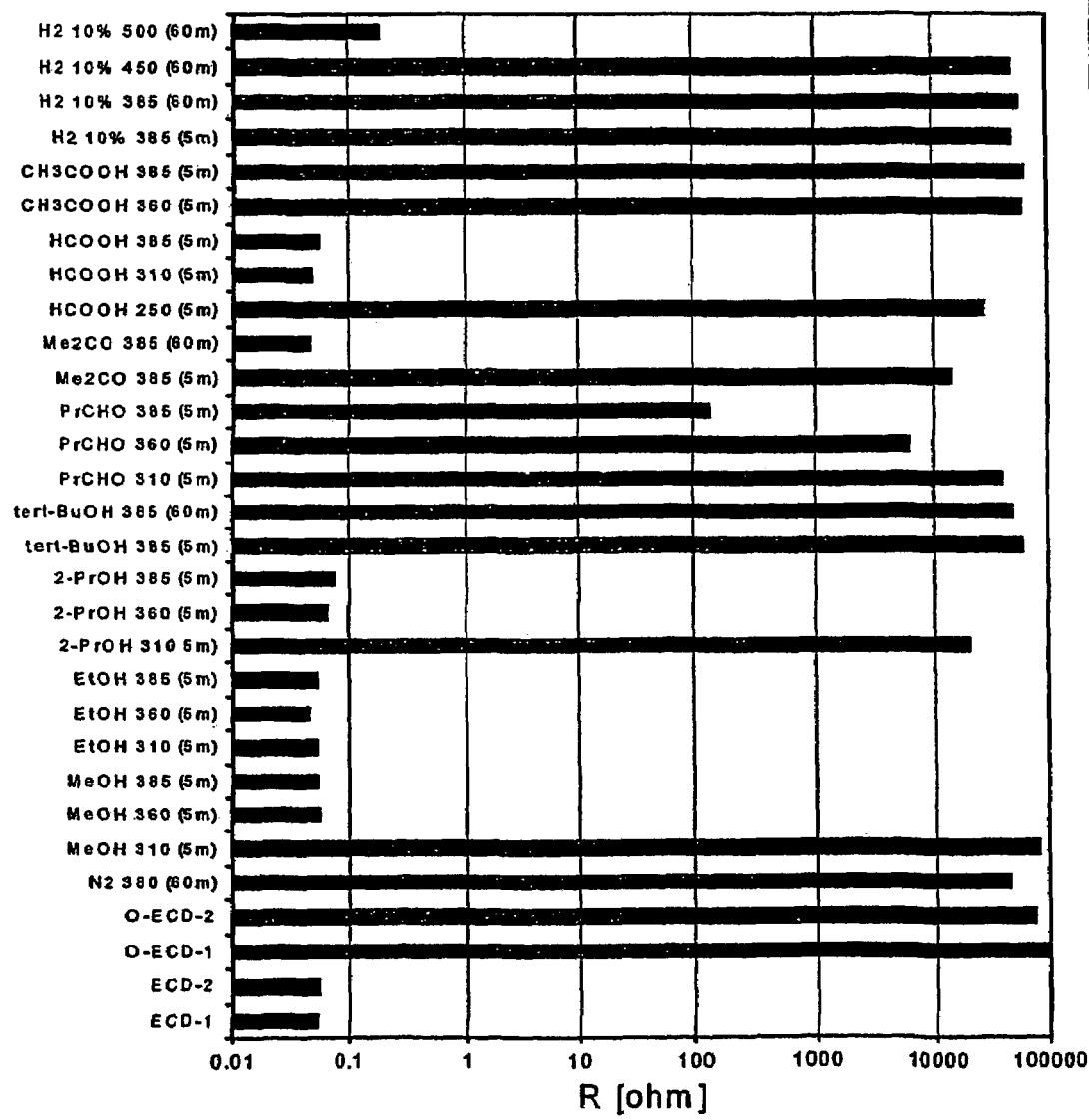
FIG. 7 depicts the electrical resistance of copper samples.

FIG. 7 depicts the electrical resistance of copper samples. The resistance value is an average of 10 measurements from each sample. ECD copper metal deposited on silicon was used for all the experiments. ECD-1 and ECD-2 are pure ECD copper metals without any additional treatments. O-ECD-1 and O-ECD-2 samples have a copper oxide coating (about 350 nm). The rest of the samples had a copper oxide coating before the reduction experiments. $N_2$ is nitrogen gas with a claimed purity of 99.9999%, MeOH is methanol, EtOH is ethanol, 2-PrOH is isopropanol, tert-BuOH is tert-butanol, PRCHO is butyraldehyde, $Me_2CO$ is acetone, HCOOH is formic acid, $CH_3COOH$ is acetic acid, and $H_2$ is hydrogen. The number after the reagent name is the reaction temperature in degrees C. The number in parentheses is the reaction time in minutes.

The composition of thin films was determined with TOF-ERDA. The samples were targeted on with 53 MeV $^{127}I^{10+}$ ions.

Figure 1:
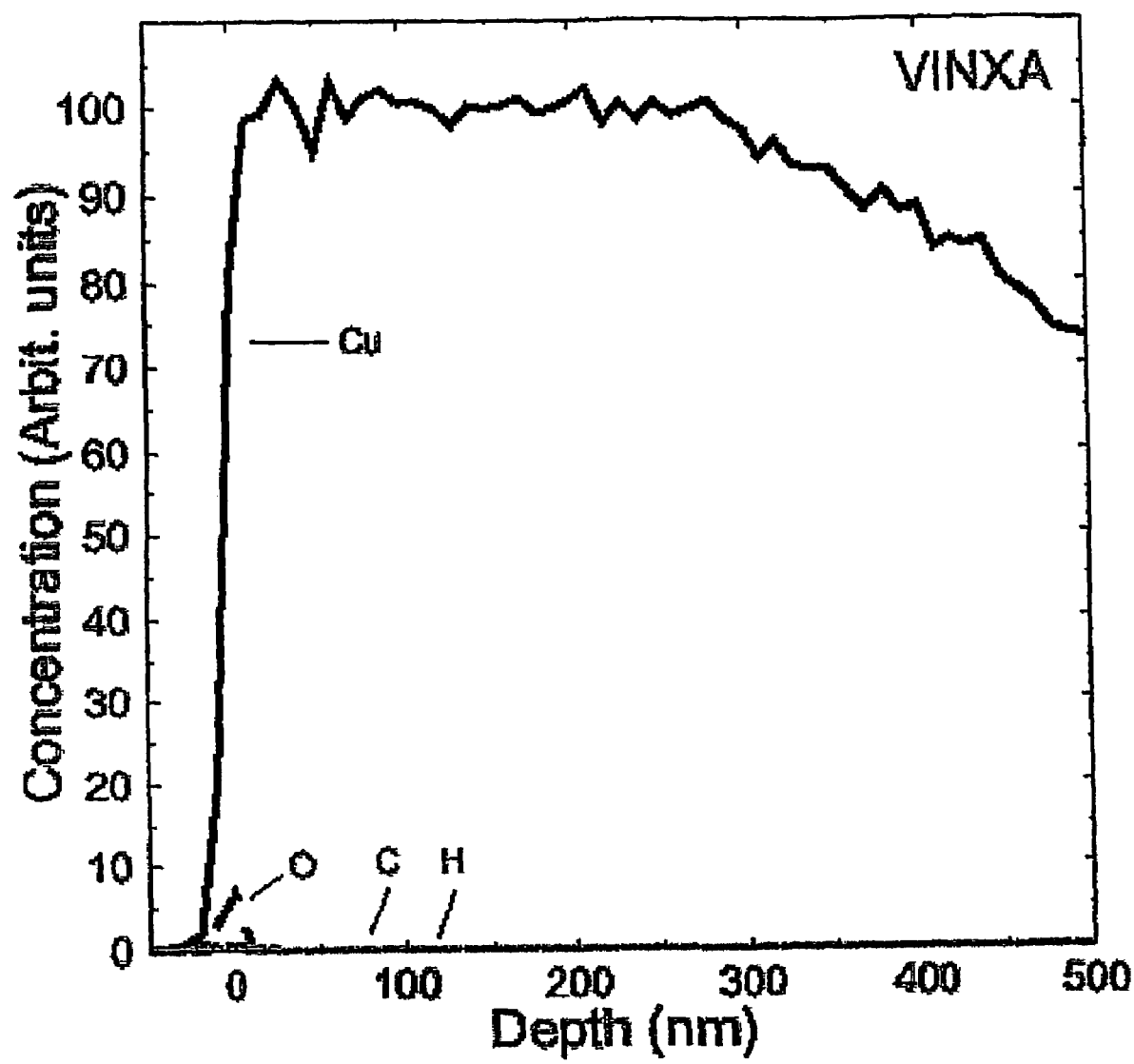
FIG. 1 depicts Time-of-Flight Elastic Recoil Detection Analysis (referred to as TOF-ERDA hereinafter) results measured from electrochemically deposited (referred to as ECD hereinafter) copper metal.

FIG. 1 depicts TOF-ERDA results measured from electrochemically deposited (referred to as ECD hereinafter) copper metal. Oxygen, carbon and hydrogen concentrations are below 0.1 at.-%.

Figure 2:
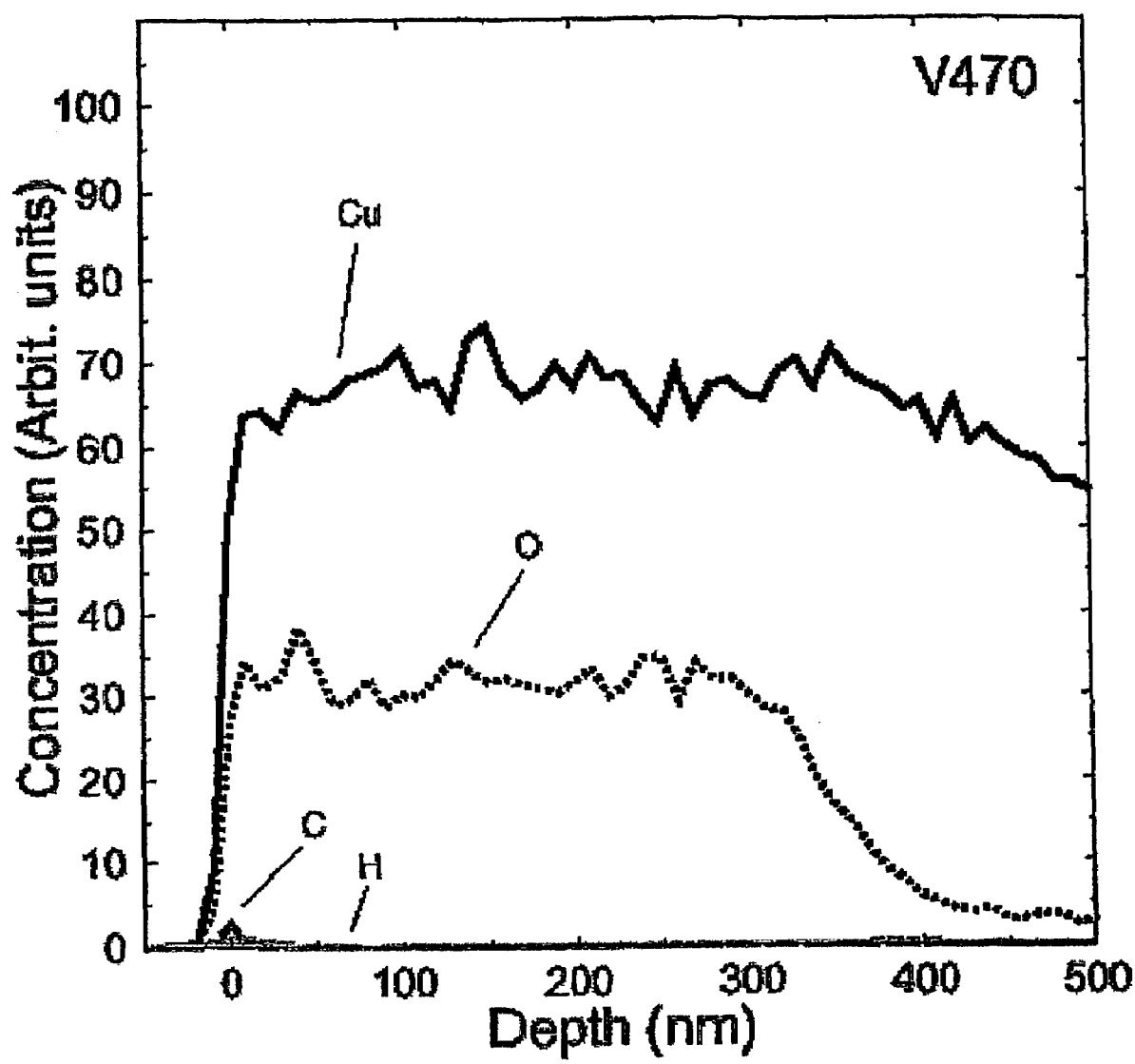
FIG. 2 depicts TOF-ERDA results measured from oxidised ECD copper.

FIG. 2 depicts TOF-ERDA results measured from oxidised ECD copper. The pre-oxidised sample was heated at 350–380° C. in nitrogen atmosphere for one hour. The 350-nm oxide layer had a composition of $Cu_2O$. There is less than 0.1 at.-% of carbon and hydrogen in the film.

Free Gibb's energies ($\Delta G_f$) for the reaction equations were calculated using Outokumpu HSC Chemistry for Windows program, version 3.02 (Outokumpu Research Ltd., Pori, Finland).

Example 1

Reduction with Methanol Vapour

A silicon substrate having a copper oxide coating on copper metal was loaded to the reaction chamber of an F-120 ALCVD™ reactor. The reaction chamber was evacuated to vacuum and heated to 250° C., 310° C., 360° C. or 385° C. depending on the experiment. The pressure of the reaction chamber was adjusted to about 5–10 mbar with flowing nitrogen gas.

Methanol is a liquid having a vapour pressure of 128 mbar at 20° C. Methanol was vaporised from an external source bottle kept at 21° C. Methanol vapour was mixed with nitrogen gas (400 std.cm$^3$/min, claimed purity 99.9999%). The gas mixture was introduced to the reaction chamber and contacted with the substrate. The reaction time was 300 s. The consumption of methanol was 0.55 g. The reactor was cooled to below 100° C. before unloading the samples to room air.

It is assumed that methanol is oxidised with copper oxide into formaldehyde and water while copper oxide reduces into copper metal according to the reaction equations R1 and R2. Further reaction between formaldehyde and copper oxide is possible resulting in the formation of carbon dioxide.

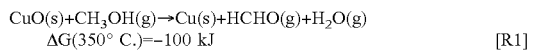

$$CuO(s)+CH_3OH(g) \rightarrow Cu(s)+HCHO(g)+H_2O(g)$$
$$\Delta G(350° C.)=-100 \text{ kJ} \qquad [R1]$$

$$Cu_2O(s)+CH_3OH(g) \rightarrow 2Cu(s)+HCHO(g)+H_2O(g) \Delta G$$
$$(350° C.)=-75 \text{ kJ} \qquad [R2]$$

Figure 3:
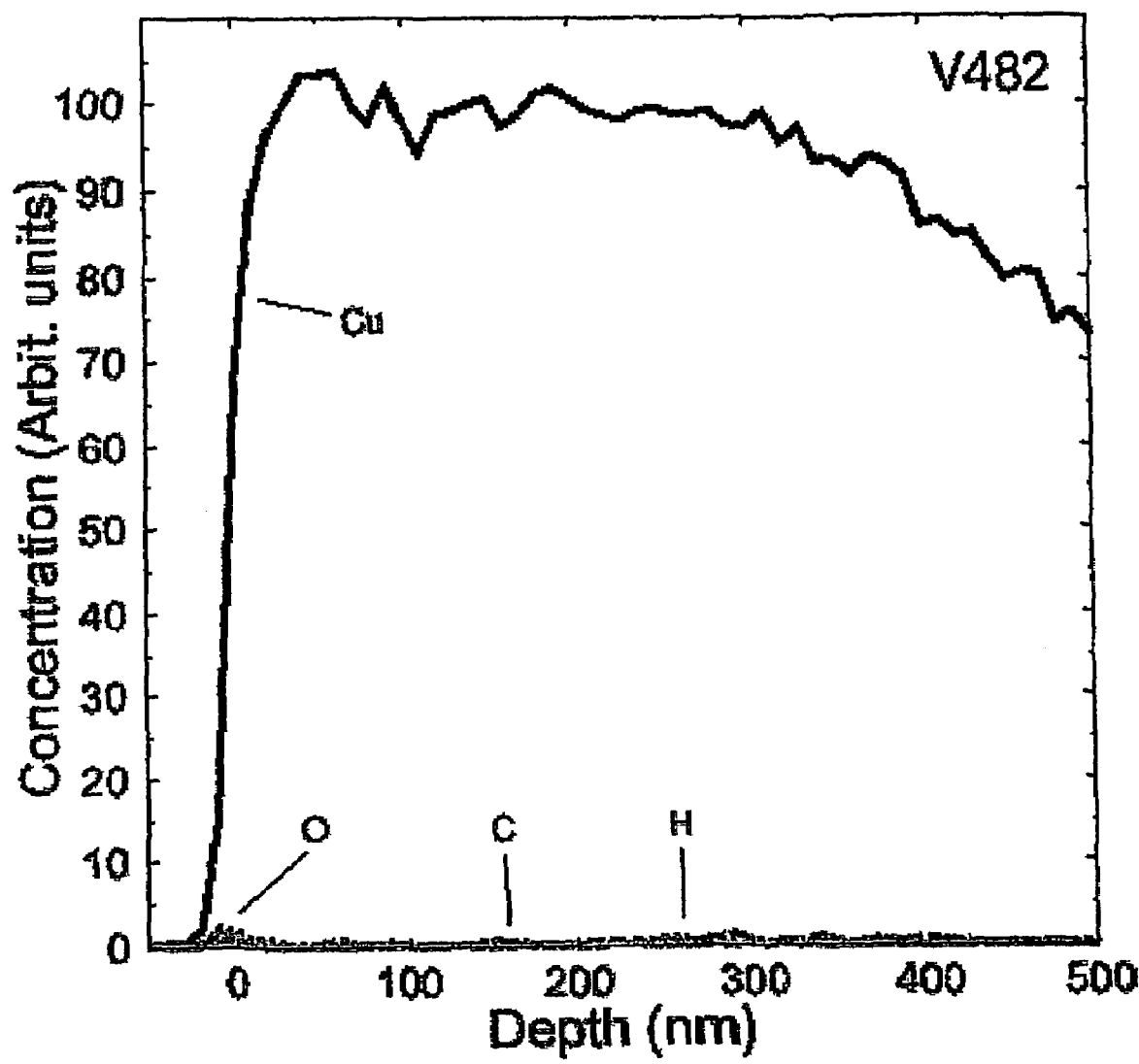
FIG. 3 depicts TOF-ERDA results measured from oxidised ECD copper which had been reduced with methanol vapour at 385° C. for 5 minutes.

FIG. 3 depicts TOF-ERDA results measured from oxidised ECD copper which had been reduced with methanol vapour at 385° C. for 5 minutes. There is 0.1 at.-% of carbon and hydrogen and 0.5 at.-% of oxygen in the film.

Example 2

Reduction with Ethanol Vapour

A silicon substrate having a copper oxide coating on copper metal was loaded to the reaction chamber of an F-120 ALCVD™ reactor. The reaction chamber was evacuated to vacuum and heated to 310° C., 360° C. or 385° C. depending on the experiment. The pressure of the reaction chamber was adjusted to about 5–10 mbar with flowing nitrogen gas.

Ethanol is a liquid having a vapour pressure of 59 mbar at 20° C. Ethanol (grade BA14, claimed purity 99.5%) was vaporised from an external source bottle kept at 21° C. Ethanol vapour was mixed with nitrogen gas (400 std. cm$^3$/min., claimed purity 99.9999%). The gas mixture was introduced to the reaction chamber and contacted with the substrate. The reaction time was 300 s. The consumption of ethanol was 0.60 g. The reactor was cooled to below 100° C. before unloading the samples to room air.

As a result, the copper oxide film reduced partially into copper metal at 310° C. The reduction was complete in five minutes at 360 and 385° C.

It is assumed that ethanol is oxidised with copper oxide into acetaldehyde and water while copper oxide reduces into copper metal according to the reaction equations R3 and R4. Further reaction between acetaldehyde and copper oxide is possible resulting in the formation of acetic acid.

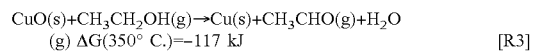

$$CuO(s)+CH_3CH_2OH(g) \rightarrow Cu(s)+CH_3CHO(g)+H_2O$$
$$(g) \Delta G(350° C.)=-117 \text{ kJ} \qquad [R3]$$

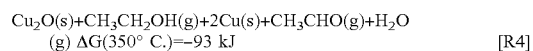

$$Cu_2O(s)+CH_3CH_2OH(g) \rightarrow 2Cu(s)+CH_3CHO(g)+H_2O$$
$$(g) \Delta G(350° C.)=-93 \text{ kJ} \qquad [R4]$$

Figure 4:
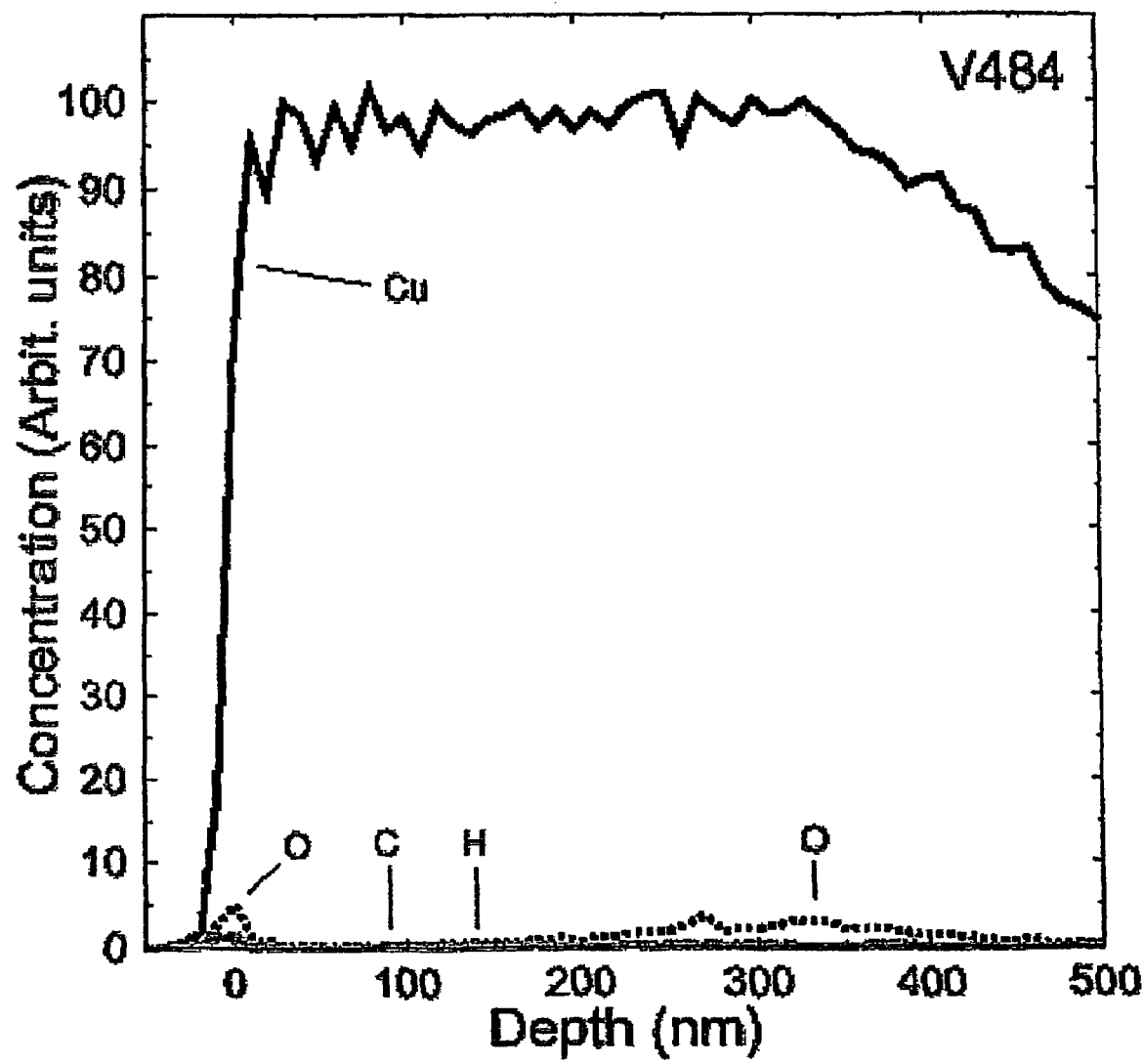
FIG. 4 depicts TOF-ERDA results measured from oxidised ECD copper which had been reduced with ethanol at 360° C. for 5 minutes.

FIG. 4 depicts TOF-ERDA results measured from oxidised ECD copper which had been reduced with ethanol at 360° C. for 5 minutes. There is 0.1–0.2 at.-% of hydrogen and carbon in the film. Down to a depth of 150 nm there is 0.2 at.-% of oxygen. Below 150 nm there is up to 2.5 at.-% of oxygen in the film.

Example 3

Reduction with 2-Propanol Vapour

A silicon substrate having a copper oxide coating on copper metal was loaded to the reaction chamber of an F-120 ALCVD™ reactor. The reaction chamber was evacuated to vacuum and heated to 310° C., 360° C. or 385° C. depending on the experiment. The pressure of the reaction chamber was adjusted to about 5–10 mbar with flowing nitrogen gas.

Isopropanol, also known as 2-propanol, is a liquid having a vapour pressure of 43 mbar at 20° C. Isopropanol (Merck VLSI Selectipur) was evaporated from an external liquid source bottle kept at 21° C. Isopropanol vapour was mixed with nitrogen gas (400 std.cm$^3$/min, claimed purity 99.9999%). The gas mixture was introduced to the reaction chamber and contacted with the substrate. The reaction time was 300 s. The consumption of isopropanol was 0.70 g. The reactor was cooled to below 100° C. before unloading the samples to room air.

As a result, copper oxide reduced completely into copper metal at 360 and 385° C. in 5 minutes. Partial reduction was obtained at 310° C.

It is assumed that 2-propanol is oxidised with copper oxide into acetone and water while copper oxide reduces into copper metal according to the reaction equations R5 and R6.

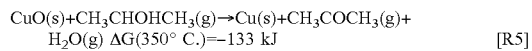

[R5]

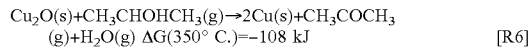

[R6]

Figure 5:
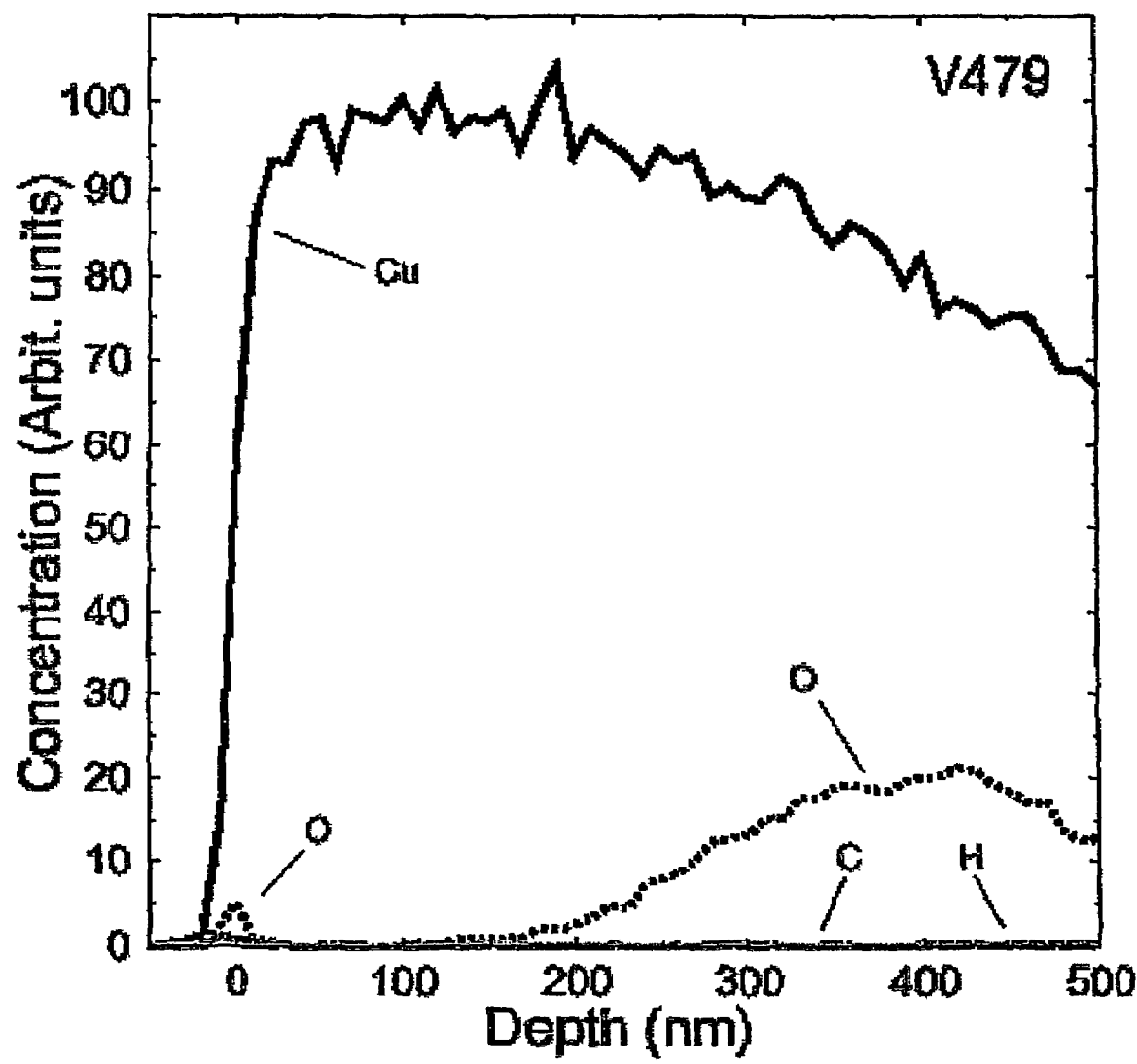
FIG. 5 depicts TOF-ERDA results measured from oxidised ECD copper which had been reduced with isopropanol at 360° C. for 5 minutes.

FIG. 5 depicts TOF-ERDA results measured from oxidised ECD copper which had been reduced with isopropanol at 360° C. for 5 minutes. There is 0.1–0.2 at.-% of hydrogen and carbon in the film. Down to a depth of 120 nm there is less than 0.2 at.-% of oxygen. Below 120 mm there is up to 20 at.-% of oxygen in the film.

Example 4

Reduction with Tert-butanol Vapour

A silicon substrate having a copper oxide coating on copper metal was loaded to the reaction chamber of an F-120 ALCVD™ reactor. The reaction chamber was evacuated to vacuum and heated to 385° C. The pressure of the reaction chamber was adjusted to about 5–10 mbar with flowing nitrogen gas.

Tert-butanol, also known as 2-methyl-2-propanol, is solid at room temperature but it melts easily at +24–+25° C. It has a vapour pressure of 36 mbar at 20° C. It was sublimated from an external liquid source bottle kept at 21° C. Tert-butanol vapour was mixed with nitrogen gas (400 std.cm$^3$/min, claimed purity 99.9999%). The gas mixture was introduced to the reaction chamber and contacted with the substrate. The reaction time varied from 5 to 60 minutes depending on the experiment. The reactor was cooled to below 100° C. before unloading the samples to room air.

As a result, it was noticed that tertiary alcohol had much lower reactivity with copper oxide than secondary and primary alcohols. Complete reduction of copper oxide into copper metal was not obtained in 60 minutes when the reaction temperature was not higher than 385° C.

Example 5

Reduction with Butyraldehyde Vapour

A silicon substrate having a copper oxide coating on copper metal was loaded to the reaction chamber of an F-120 ALCVD™ reactor. The reaction chamber was evacuated to vacuum and heated to 310, 360 or 385° C. depending on the experiment. The pressure of the reaction chamber was adjusted to about 5–10 mbar with flowing nitrogen gas.

Butyraldehyde is a liquid having a vapour pressure of 148 mbar at 20° C. It was evaporated from an external liquid source bottle at 21° C. Butyraldehyde vapour was mixed with nitrogen gas (400 std. cm$^3$/min., claimed purity 99.9999%). The gas mixture was introduced to the reaction chamber and contacted with the substrate. Reduction experiments were made at 310, 360 and 385° C. The reaction time was 300 s. The consumption of butyraldehyde was 1.3 g. The reactor was cooled to below 100° C. before unloading the samples to room air.

As a result, copper oxide was partially reduced into copper metal at 360 and 385° C. in 5 minutes. Resistance measurements showed that sides of the substrate had some oxide left while the middle of the substrate had very low resistance. Based on alcohol experiments with an OH group bound to variable sized hydrocarbons, it is expected that higher reactivity is obtained with smaller aldehyde molecules, such as formaldehyde HCHO or glyoxal $C_2H_2O_2$, than with butyraldehyde.

It is assumed that butyraldehyde is oxidised with copper oxide into butyric acid, that has a clearly distinguishable odour, while copper oxide reduces into copper metal according to the reaction equations R7 and R8.

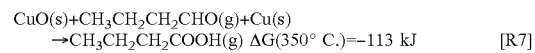

[R7]

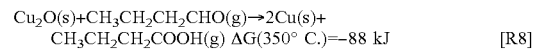

[R8]

Example 6

Reduction with Acetone Vapour

A silicon substrate having a copper oxide coating on copper metal was loaded to the reaction chamber of an F-120 ALCVD™ reactor. The reaction chamber was evacuated to vacuum and heated to 385° C. The pressure of the reaction chamber was adjusted to about 5–10 mbar with flowing nitrogen gas.

Acetone is the most simple ketone. It is a liquid having a vapour pressure of 233 mbar at 20° C. It was evaporated from an external liquid source bottle kept at 21° C. Acetone vapour was mixed with nitrogen gas (400 std.cm$^3$/min, claimed purity 99.9999%). The gas mixture was introduced to the reaction chamber and contacted with the substrate. Reduction experiments were made at 385° C. Acetone vapour was in contact with the substrates for 5 or 60 minutes depending on the experiment. The consumption of acetone was 0.8 g (5 min) and 9.3 g (60 min). The reactor was cooled to below 100° C. before unloading the samples to room air.

It was noticed that the reactivity of a ketone was clearly inferior to the reactivity of an aldehyde.

Example 7

Reduction with Formic Acid Vapour

A silicon substrate having a copper oxide coating on copper metal was loaded to the reaction chamber of an F-120 ALCV™ reactor. The reaction chamber was evacuated to vacuum and heated to 250, 310 or 385° C. depending on the experiment. The pressure of the reaction chamber was adjusted to about 5–10 mbar with flowing nitrogen gas.

Formic acid is the most simple carboxylic acid. It is a liquid having a vapour pressure of 42 mbar at 20° C. It was evaporated from an external liquid source bottle kept at 21° C. Formic acid vapour was mixed with nitrogen gas (400 std. cm$^3$/min., claimed purity 99.9999%). The gas mixture was introduced to the reaction chamber and contacted with the substrate for 300 s. The consumption of formic acid was 0.5 g. The reactor was cooled to below 100° C. before unloading the samples to room air.

As a result, copper oxide reduced completely into copper metal in 5 minutes at 310 and 385° C. It is assumed that formic acid is oxidised with copper oxide into carbon dioxide and water while copper oxide reduces into copper metal according to the reaction equations R9 and R10.

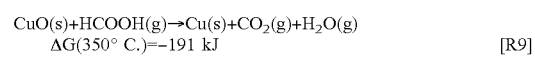

[R9]

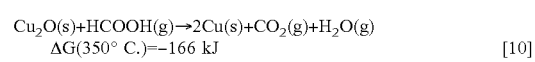

[10]

Figure 6:
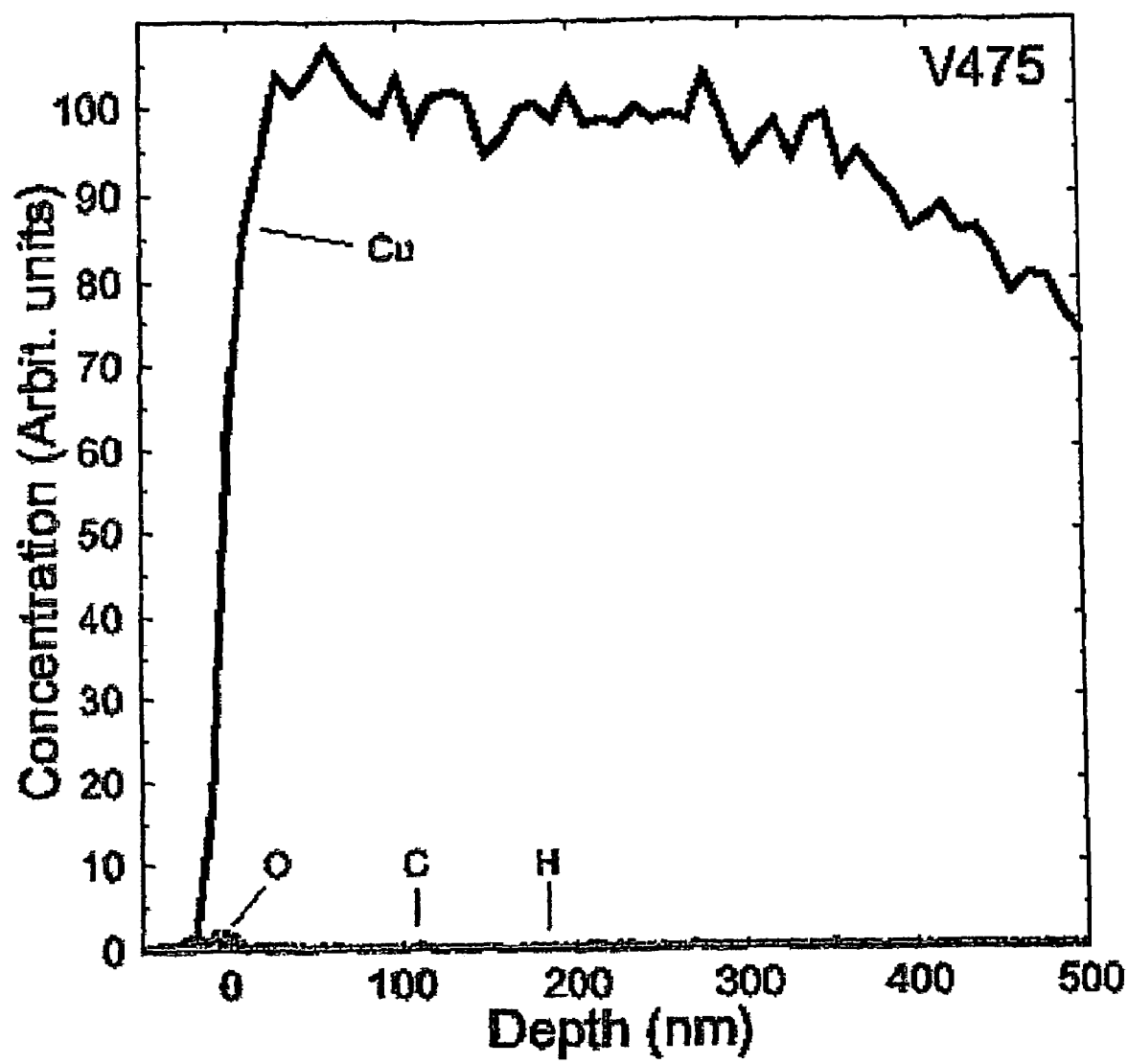
FIG. 6 depicts TOF-ERDA results measured from oxidised ECD copper which had been reduced with formic acid at 310° C. for 5 minutes.

FIG. 6 depicts TOF-ERDA results measured from oxidised ECD copper which had been reduced with formic acid at 310° C. for 5 minutes. There is 0.2–0.3 at.-% of oxygen and hydrogen and 0.1 at.-% of carbon in the film.

Example 8

Reduction with Acetic Acid Vapour

A silicon substrate having a copper oxide coating on copper metal was loaded to the reaction chamber of an F-120 ALCVD™ reactor. The reaction chamber was evacuated to vacuum and heated to 360 or 385° C. depending on the experiment. The pressure of the reaction chamber was adjusted to about 5–10 mbar with flowing nitrogen gas.

Acetic acid $CH_3COOH$ is a liquid having a vapour pressure of 15 mbar at 20° C. It was evaporated from an external liquid source bottle kept at 21° C. Acetic acid vapour was mixed with nitrogen gas (400 std.cm³/min, claimed purity 99.9999%). The gas mixture was introduced to the reaction chamber and contacted with the substrate for 300 s. The consumption of $CH_3COOH$ was 0.8 g. The reactor was cooled to below 100° C. before unloading the samples to room air. It was observed that the reactivity of acetic acid was inferior to the reactivuty of formic acid.

Example 9 (Comparative)

Reduction with Hydrogen Gas

A silicon substrate having a copper oxide coated copper metal film was loaded to the reaction chamber. The reaction chamber was evacuated to vacuum and heated to 385, 450 or 500° C. depending on the experiment. The pressure of the reaction chamber was adjusted to about 5–10 mbar with flowing nitrogen gas.

A hydrogen/nitrogen gas mixture (10 vol.-% $H_2$) having a mass flow rate of 300 std. cm³/min was used as a reducing agent. The gas mixture was introduced to the reaction chamber together with additional 400 std. cm³/min of nitrogen and contacted with the substrate. The reaction time varied from 5 to 60 minutes depending on the experiment.

As a result, hydrogen had rather low reactivity at low temperatures. Treatment with $H_2$ for one hour at 500° C. was needed for obtaining almost complete reduction of the copper oxide layer.

It is assumed that hydrogen is oxidised with copper oxide into water while copper oxide reduces into copper metal according to the reaction equations R11 and R12.

$CuO(s)+H_2(g) \rightarrow Cu(s)+H_2O(g)$  $\Delta G(350°\ C.)=-114$ kJ  [R1]

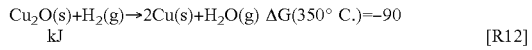

$Cu_2O(s)+H_2(g) \rightarrow 2Cu(s)+H_2O(g)$  $\Delta G(350°\ C.)=-90$ kJ  [R12]

Example 10

Reduction of Copper(II)Oxide with Ethanol

A silicon substrate containing copper on the surface was first treated with ozone gas in an F-120 flow-type ALCVD™ reactor to create CuO film where copper has an oxidation state of 2+. After the $O_3$ treatment the substrate was unloaded for inspection. There was a dark grey coating on the substrate. The film had high resistance in the order of megaobm measured with Hewlett Packard 34401A multimeter.

Then the substrate with the copper oxide coating was again loaded to the reaction chamber of an F-120 flow-type ALCVD™ reactor. The reaction chamber was evacuated to vacuum and heated to 310 or 360° C. depending on the experiment. The pressure of the reaction chamber was adjusted to about 5–10 mbar with flowing nitrogen gas.

Ethanol with a purity of 99.5% was used as a reducing agent. Ethanol vapour was mixed with 400 std. cm³/min. of nitrogen gas (claimed purity 99.9999%). The gas mixture was introduced to the reaction chamber and contacted with the substrate for 300 s. After the reduction process the reactor was cooled to below 100° C. and the substrate was unloaded for inspection.

As a result, there was a thin film with a copper metal lustre on the silicon substrate. The film had good adhesion on silicon and no peeling of the film was observed. The resistance of the film had dropped from megaohm range to ohm range, i.e. 6 orders of magnitude. The experiments showed that CuO can be successfully reduced into copper metal.

Example 11

Reduction of Cobalt Oxide with Ethanol

Cobalt oxide thin film on a silicon substrate was heated to 400° C. and exposed to ethanol vapor for 10 minutes in an F-200 flow-type ALCVD™ reactor. The pressure of the reaction chamber was adjusted to about 5–10 mbar with a mechanical vacuum pump and flowing nitrogen gas. According to EDS measurements, the 64 nm thin film had contained before the ethanol exposure oxygen and cobalt in a ratio of 1.1, which indicated the presense of CoO with some $CO_3O_4$. After the ethanol vapor exposure the thin film on the substrate consisted of 100% Co and the thickness had decreased to 39 nm due to the removal of oxygen from the cobalt oxide. The cobalt metal film had excellent adhesion to the silicon substrate.

Example 12

Reduction of Palladium Oxide with Ethanol

Palladium oxide PdO thin films on silicon and $SiO_2$, TiN, $W_xN$, and $W_yC$ coated substrates were loaded into an F-200 flow-type ALCVD™ reactor. The pressure of the reaction chamber was adjusted to about 5–10 mbar with a mechanical vacuum pump and flowing nitrogen gas. The samples were heated to 400° C. and exposed to ethanol vapor for 5 minutes. The thickness of the resulting palladium metal film was 10–30 nm depending on the initial palladium oxide thin film thickness. According the EDS measurements the reduced thin film consisted of 100% Pd with non-detectable amount of oxygen. The palladium metal film had excellent adhesion on silicon, $SiO_2$, TiN, $W_xN$, and $W_yC$ surfaces after the reduction process.

What is claimed is:

1. A process for producing an integrated circuit comprising providing a substrate comprising a via through an insulating layer and at least partially reducing a metal oxide layer on the via bottom to elemental metal with a gaseous organic compound comprising one or more functional groups selected from the group consisting of alcohol (—OH), aldehyde (—CHO) and carboxylic acid (—COOH).

2. The process of claim 1, wherein the metal oxide layer comprises copper oxide.

3. The process of claim 1, wherein the elemental metal is selected from the group consisting of copper (Cu), molybdenum (Mo), tungsten (W), rhenium (Re), iron (Fe), ruthenium (Ru), osmium (Os), cobalt (Co), rhodium (Rh), iridium (Ir), nickel (Ni), palladium (Pd), platinum (Pt), silver (Ag), gold (Au), zinc (Zn), cadmium (Cd), indium (In), germanium (Ge), tin (Sn), lead (Pb), antimony (Sb) and bismuth (Bi).

4. The process of claim 1, wherein the metal oxide layer is formed by the oxidation of a metal layer.

5. The process of claim 1, wherein the metal oxide layer is formed after an etch stop is removed from the via bottom.

6. The process of claim 5, wherein the etch stop comprises silicon nitride.

7. The process of claim 1, additionally comprising subsequently depositing a diffusion barrier onto the reduced surface.

8. The process of claim 1, wherein the reduced metal oxide is a seed layer for an electrochemically deposited metal layer.

9. The process of claim 1, wherein the reduction is carried out at a temperature of 400° C. or less.

10. The process of claim 1, wherein the gaseous organic compound is selected from the group consisting of primary alcohols, secondary alcohols, tertiary alcohols, polyhydroxy alcohols, cyclic alcohols, aromatic alcohols, halogenated alcohols and other derivatives of alcohols.

11. The process of claim 10, wherein the organic compound comprises a primary alcohol having the general formula (I)

$$R^1\text{—OH} \quad (I)$$

wherein $R^1$ is a linear or branched $C_1$–$C_{20}$ alkyl or alkenyl group.

12. The process of claim 11, wherein $R^1$ is selected from the group consisting of methyl, ethyl, propyl, butyl, pentyl and hexyl.

13. The process of claim 10, wherein the organic compound comprises a secondary alcohol having the general formula (II)

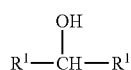

$$(II)$$

wherein each $R^1$ is selected from the group consisting of linear or branched $C_1$–$C_{20}$ alkyl and alkenyl groups.

14. The process of claim 13, wherein each $R^1$ is selected from the group consisting of methyl, ethyl, propyl, butyl, pentyl and hexyl.

15. The process of claim 10, wherein the organic compound comprises a tertiary alcohol having the general formula (III)

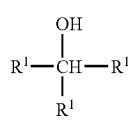

$$(III)$$

wherein each $R^1$ is selected independently from the group consisting of linear or branched $C_1$–$C_{20}$ alkyl and alkenyl groups.

16. The process of claim 15, wherein each $R^1$ is selected from the group consisting of methyl, ethyl, propyl, butyl, pentyl and hexyl.

17. The process of claim 10, wherein the organic compound comprises a cyclic alcohol having an —OH group attached to at least one carbon atom which is part of a ring of 1–10 atoms.

18. The process of claim 10, wherein the organic compound comprises an aromatic alcohol having at least one —OH group attached either to the benzene ring or to a carbon atom in a side-chain attached to benzene ring.

19. The process of claim 1, wherein the gaseous organic compound is selected from the group consisting of:

(i) compounds having the general formula (V)

$$R^3\text{—CHO} \quad (V)$$

wherein $R^3$ is hydrogen or a linear or branched $C_1$–$C_{20}$ alkyl or alkenyl group, (ii) compounds having the general formula (VI)

$$\text{OHC—}R^4\text{—CHO} \quad (VI)$$

wherein $R^4$ is zero or a linear or branched $C_1$–$C_{20}$ saturated or unsaturated hydrocarbon, (iii) halogenated aldehydes, and (iv) other derivatives of aldehydes.

20. The process of claim 19, wherein $R^3$ is selected from the group consisting of methyl, ethyl, propyl, butyl, pentyl and hexyl.

21. The process of claim 1, wherein the gaseous organic compound is selected from the group consisting of:

(i) compounds having the general formula (VII)

$$R^5\text{COOH} \quad (VII)$$

wherein $R^5$ is hydrogen or a linear or branched $C_1$–$C_{20}$ alkyl or alkenyl group, (ii) polycarboxylic acids, (iii) halogenated carboxylic acids, and (iv) other derivatives of carboxylic acids.

22. The process of claim 21, wherein $R^5$ is selected from the group consisting of methyl, ethyl, propyl, butyl, pentyl and hexyl.

23. The process of claim 1, wherein the via is part of a dual damascene structure.

24. A method for reducing copper oxide on the bottom of a via on a substrate prior to deposition of a diffusion barrier comprising exposing the copper oxide to one or more gaseous organic compounds selected from the group consisting of alcohols, aldehydes and carboxylic acids.

25. The method of claim 24, wherein the copper oxide is partially reduced to copper.

26. The method of claim 24, wherein the copper oxide layer is deposited by ALD.

27. The method of claim 24, additionally comprising electrochemically depositing copper in the via.

28. A method for forming an integrated circuit on a substrate comprising at least one metal layer, the method comprising:

depositing a first dielectric layer on the substrate;

forming a via through the first dielectric layer whereby the metal layer is at least partially exposed and oxidized at the bottom of the via; and reducing the oxidized metal at the bottom of the via with an organic reducing agent selected from the group consisting of alcohols, aldehydes and carboxylic acids.

29. The method of claim 28, additionally comprising depositing a second dielectric layer.

30. The method of claim 28, additionally comprising depositing a diffusion barrier on the reduced metal at the bottom of the via.

31. A process for producing an integrated circuit comprising at least partially reducing a metal oxide layer on a via bottom to elemental metal with a gaseous organic compound comprising at least one alcohol (—OH) group and selected from the group consisting of primary alcohols, secondary alcohols, tertiary alcohols, polyhydroxy alcohols, cyclic alcohols, aromatic alcohols, halogenated alcohols and other derivatives of alcohols.

32. A process for producing an integrated circuit comprising at least partially reducing a metal oxide layer on a via bottom to elemental metal with a gaseous organic compound selected from the group consisting of:
   (a) organic compounds comprising at least one aldehyde (—CHO) group and selected from the group consisting of:
   (i) compounds having the general formula (V)

$$R^3\text{—CHO} \tag{V}$$

wherein $R^3$ is hydrogen or a linear or branched $C_1$–$C_{20}$ alkyl or alkenyl group, (ii) compounds having the general formula (VI)

$$\text{OHC—}R^4\text{—CHO} \tag{VI}$$

wherein $R^4$ is zero or a linear or branched $C_1$–$C_{20}$ saturated or unsaturated hydrocarbon,
   (iii) halogenated aldehydes, and
   (iv) other derivatives of aldehydes; and
   (b) organic compounds comprising at least one carboxylic acid (—COOH) group and selected from the group consisting of:
   (i) compounds having the general formula (VII)

$$R^5\text{COOH} \tag{VII}$$

wherein $R^5$ is hydrogen or a linear or branched $C_1$–$C_{20}$ alkyl or alkenyl group,
   (ii) polycarboxylic acids,
   (iii) halogenated carboxylic acids, and
   (iv) other derivatives of carboxylic acids.

* * * * *

UNITED STATES PATENT AND TRADEMARK OFFICE
CERTIFICATE OF CORRECTION

PATENT NO. : 7,241,677 B2
APPLICATION NO. : 11/110345
DATED : July 10, 2007
INVENTOR(S) : Pekka Juha Soininen and Kai-Erik Elers It is certified that error appears in the above-identified patent and that said Letters Patent is hereby corrected as shown below:

Title Page 2, Col. 1 (Other Publications), line 13, please delete "ThinRuthenium" and insert -- Thin Ruthenium --, therefor.

Title Page 2, Col. 2 (Other Publications), line 16, please delete "SiO2" and insert -- $SiO_2$ --, therefor.

Title Page 2, Col. 2 (Other Publications), lines 26-27, please delete Capacitator Technonolgy" and insert -- Capacitor Technology --, therefor.

Title Page 2, Col. 2 (Other Publications), line 34, please delete "Edition ," and insert -- Edition, --, therefor.

In Col. 2, line 50, please delete "System-Nummer 60," and insert -- System-Number 60, --, therefor.

In Col. 3, line 12 (approx.), before "hydrogen", please insert -- ( --.

In Col. 6, line 22 (approx.), before "metal", please delete "iminating".

In Col. 10, line 15, please delete "(cf" and insert -- (cf. --, therefor.

In Col. 11, line 41, please delete "$OSO_2$" and insert -- $OsO_2$ --, therefor.

In Col. 11, line 59, please delete "—H" and insert -- —OH --, therefor.

In Col. 14, line 33, after "is", please delete "a"

In Col. 14, line 50 (approx.), please delete "isturbing" and insert -- disturbing --, therefor.

In Col. 14, line 51 (approx.), please delete "harnflil" and insert -- harmful --, therefor.

UNITED STATES PATENT AND TRADEMARK OFFICE
CERTIFICATE OF CORRECTION

PATENT NO. : 7,241,677 B2
APPLICATION NO. : 11/110345
DATED : July 10, 2007
INVENTOR(S) : Pekka Juha Soininen and Kai-Erik Elers It is certified that error appears in the above-identified patent and that said Letters Patent is hereby corrected as shown below:

In Col. 16, line 14 (approx.), please delete "R—CHO" and insert -- $R^3$—CHO --, therefor.

In Col. 16, line 20, please delete "asetaldehyde" and insert -- acetaldehyde --, therefor.

In Col. 16, line 21, please delete "($CH_3CH_2CH_2HO$)" and insert -- ($CH_3CH_2CH_2\mathbf{C}HO$) --, therefor.

In Col. 17, line 11, please delete "PRCHO" and insert -- PrCHO --, therefor.

In Col. 18, line 32 (approx.), before "2Cu(s)", please delete "+" and insert -- → --, therefor.

In Col. 19, line 10, please delete "mm" and insert -- nm --, therefor.

In Col. 20, line 6 (approx.), before "Cu(s)", please delete "+" and insert -- → --, therefor.

In Col. 20, line 7 (approx.), before "$CH_3CH_2CH_2COOH(g)$", please delete "→" and insert -- + --, therefor.

In Col. 20, line 40 (approx.), please delete "ALCV$^{TM}$" and insert -- ALCVD$^{TM}$ --, therefor.

UNITED STATES PATENT AND TRADEMARK OFFICE
CERTIFICATE OF CORRECTION

PATENT NO. : 7,241,677 B2
APPLICATION NO. : 11/110345
DATED : July 10, 2007
INVENTOR(S) : Pekka Juha Soininen and Kai-Erik Elers It is certified that error appears in the above-identified patent and that said Letters Patent is hereby corrected as shown below:

In Col. 21, line 20 (approx.), please delete "reactivuty" and insert -- reactivity --, therefor.

In Col. 21, line 45 (approx.), please delete "[R1]" and insert -- [R11] --, therefor.

In Col. 21, line 60, please delete "megaobm" and insert -- megaohm --, therefor.

In Col. 22, line 26 (approx.), please delete "presense" and insert -- presence --, therefor.

Signed and Sealed this

First Day of April, 2008

JON W. DUDAS
*Director of the United States Patent and Trademark Office*